United States Patent
Choi et al.

(10) Patent No.: US 9,742,428 B2
(45) Date of Patent: Aug. 22, 2017

(54) DELTA SIGMA MODULATOR FOR SHAPING NOISE AND AUDIO CODEC HAVING THE SAME

(71) Applicant: Samsung Electronics Co., Ltd., Suwon-si (KR)

(72) Inventors: Mooyeol Choi, Yongin-si (KR); Hyungdong Roh, Yongin-si (KR); Bai-Sun Kong, Suwon-si (KR); Sunwoo Kwon, Seongnam-si (KR); Myung-Jin Lee, Hwaseong-si (KR)

(73) Assignees: SAMSUNG ELECTRONICS CO., LTD. (KR); RESEARCH & FOUNDATION SUNGKYUNKWAN UNIVERSITY (KR)

( * ) Notice: Subject to any disclaimer, the term of this patent is extended or adjusted under 35 U.S.C. 154(b) by 0 days.

(21) Appl. No.: 15/097,715

(22) Filed: Apr. 13, 2016

(65) Prior Publication Data

US 2017/0019123 A1    Jan. 19, 2017

(30) Foreign Application Priority Data

Jul. 17, 2015   (KR) .................... 10-2015-0101773

(51) Int. Cl.
| | |
|---|---|
| G06F 17/00 | (2006.01) |
| H03M 3/00 | (2006.01) |
| G06F 3/16 | (2006.01) |

(52) U.S. Cl.
CPC ............ *H03M 3/422* (2013.01); *G06F 3/162* (2013.01); *H03M 3/372* (2013.01); *H03M 3/50* (2013.01)

(58) Field of Classification Search
CPC .......... H03M 3/422; H03M 3/39; H03M 3/50; H03M 3/372; H03M 3/502; G06F 3/162
See application file for complete search history.

(56) References Cited

U.S. PATENT DOCUMENTS

| | | |
|---|---|---|
| 5,818,374 A | 10/1998 | Tan |
| 6,462,687 B1 | 10/2002 | Eshraghi et al. |

(Continued)

FOREIGN PATENT DOCUMENTS

JP         2013201542         10/2013

OTHER PUBLICATIONS

Bernhard E. Boser, "The Design of Sigma-Delta Modulation Analog-to Digital Converters", IEEE Journal of Solid-State Circuits, vol. 23 No. 6, Dec. 1988, pp. 1298-1308.

(Continued)

*Primary Examiner* — Fan Tsang
*Assistant Examiner* — David Siegel
(74) *Attorney, Agent, or Firm* — Onello & Mello, LLP

(57) ABSTRACT

A delta-sigma modulator includes a loop filter, a quantizer configured to change an analog output signal into a digital signal, and a digital-to-analog converter configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with a reference voltage, and the second capacitor is discharged and generates a charge corresponding to the noise. In a next first sampling period, the first capacitor is discharged, and at the same time, the second capacitor generates a noise current corresponding to the noise using the charge and is charged with a reference voltage.

20 Claims, 17 Drawing Sheets

(56) References Cited

U.S. PATENT DOCUMENTS

| | | | |
|---|---|---|---|
| 6,466,143 | B2 | 10/2002 | Eshraghi et al. |
| 6,922,161 | B2 | 7/2005 | Lee |
| 7,379,005 | B2* | 5/2008 | Wiesbauer ............... H03L 7/08 327/147 |
| 7,525,464 | B2 | 4/2009 | Maloberti et al. |
| 7,880,654 | B2 | 2/2011 | Oliaei et al. |
| 8,072,363 | B2 | 12/2011 | Yu et al. |
| 8,164,500 | B2 | 4/2012 | Ahmed et al. |
| 8,390,495 | B2 | 3/2013 | Shabra |
| 2008/0106447 | A1* | 5/2008 | Zare-Hoseini ....... H03M 3/372 341/135 |
| 2010/0219999 | A1 | 9/2010 | Oliaei et al. |

OTHER PUBLICATIONS

James A. Cherry and W. Martin Snelgrove, "Clock Jitter and Quantizer Metastability in Continuous-Time Delta-Sigma Modulators", IEEE Transactions on Circuits and Systems-II: Analog and Digital Signal Processing, vol. 46, No. 6, Jun. 1999, pp. 661-676.

Noicola Da Dalt et al., "On the Jitter Requirements of the Sampling Clock for Analog-to-Digital Converters", IEEE Transactions on Circuits and Systems-I: Fundamental Theory and Applications, vol. 49, No. 9, Sep. 2002, pp. 1354-1360.

Luschas and Lee, "High-Speed [Symbols] Modulators With Reduced Timing Jitter Sensitivity", IEEE Transactions on Circuits and Systems-II: Analog and Digital Signal Processing, vol. 49, No. 11, Nov. 2002, pp. 712-720.

Latin and Beilleau, "Design of Continuous-Time [symbols] Modulators with Sine-Shaped Feedback DACs", Circuits and Systems, 2005. ISCAS 2005. IEEE International Symposium on, pp. 3672-3675 /May 23-26, 2005.

Ortmanns et al., "A Continuous-Time [sigma-delta symbols] Modulator With Reduced Sensitivity to Clock Jitter Through SCR Feedback", IEEE Transactions on Circuits and Systems-I: Regular Papers, vol. 52, No. 5, May 2005, pp. 875-884.

Hoseini and Kale, "Continuous Time Delta Sigma modulators with Reduced Clock Jitter Sensitivity", Circuits and Systems, 2006. ISCAS 2006. Proceedings. 2006 IEEE International Symposium on., pp. 5371-5374/May 21-24, 2006.

Reddy and Pavan, "Fundamental Limitations of Continuous-Time Delta-Sigma Modulators Due to Clock Jitter", IEEE Transactions on Circuits and Systems-I: Regular Papers, vol. 54, No. 10, Oct. 2007, pp. 2184-2194.

Anderson and Sundstrom, "Design and Measurement of a CT [delta-sigma symbols] ADC With Switched-Capacitor Switched-Resistor Feedback", IEEE Journal of Solid-State Circuits, vol. 44, No. 2, Feb. 2009, pp. 473-483.

Chopp and Hamoui, "Analysis of Clock-Jitter Effects in Continuous-Time [delta-sigma symbols] Modulators Using Discrete-Time Models", IEEE Transactions on Circuits and Systems-I: Regular Papers, vol. 56, No. 6, Jun. 2009, pp. 1134-1145.

Maghari and Moon, "Precise Area-Controlled Return-to-Zero Current Steering DAC with Reduced Sensitivity to Clock Jitter", Circuits and Systems (ISCAS), Proceedings of 2010 IEEE International Symposium on., pp. 297-300/May 20-Jun. 2, 2010.

Jo et al., "A 20-MHz Bandwidth Continuous-Time Sigma-Delta Modulator With Jitter Immunity Improved Full Clock Period SCR (FSCR) DAC and High-Speed DWA", IEEE Journal of Solid-State Circuits, vol. 46, No. 11, Nov. 2011, pp. 2469-2477.

Radjen and Andreani, "A Continuous Time [delta-sigma symbols] Modulator with Reduced Clock Jitter Sensitivity through DSCR Feedback", Analog Integrated Circuits and Signal Processing, vol. 74, Issue 1, p. 21-31/Jan. 2013.

Shettigar and Pavan, "Design Techniques for Wideband Single-Bit Continuous-Time [delta-sigma symbols] Modulators With FIR Feedback DACs", IEEE Journal of Solid-State Circuits, vol. 47, No. 12, Dec. 2012, pp. 2865-2879.

Nandi et al., "Continuous-Time [delta-sigma symbols] Modulators With Improved Linearity and Reduced Clock Jitter Sensitivity Using the Switched-Capacitor Return-to-Zero DAC", IEEE Journal of Solid-State Circuits, vol. 48, No. 8, Aug. 2013, pp. 1795-1805.

Edward and Martinez, "General Analysis of Feedback DAC's Clock Jitter in Continuous-Time Sigma-Delta Modulators", IEEE Transactions on Circuits and Systems-II: Express Briefs, vol. 61 No. 7, Jul. 2014, pp. 506-510.

Oliaei,"Sigma-Delta Modulator With Spectrally Shaped Feedback", IEEE Transactions on Circuits and Systems-II: Analog and Digital Signal Processing, vol. 50, No. 9, Sep. 2003, pp. 518-530.

Mitteregger et al., "A 20-mW 640-MHz CMOS Continuous-Time [sigma-delta symbols] ADC With 20-MHz Signal Bandwidth, 80-dB Dynamic Range and 12-bit ENOB", IEEE Journal of Solid-State Circuits, vol. 41, No. 12, Dec. 2006, pp. 2641-2649.

Colodro and Torralba, "New Continuous-Time Multibit Sigma-Delta Modulators With Low Sensitivity to Clock Jitter", IEEE Transactions on Circuits and Systems-I: Regular Papers, vol. 56, No. 1, Jan. 2009, pp. 74-83.

Sukumaran and Pavan, "Low Power Design Techniques for Single-Bit Audio Continuous-Time Delta Sigma ADCs Using FIR Feedback", IEEE Journal of Solid-State Circuits, vol. 49, No. 11, Nov. 2014, pp. 2515-2525.

Rombouts et al., "An Approach to Tackle Quantization Noise Folding in Double-Sampling [sigma-delta symbols] Modulation A/D Converters", IEEE Transactions on Circuits and Systems-II: Analog and Digital Signal Processing, vol. 50, No. 4, Apr. 2003, pp. 157-163.

Yan and Sanchez-Sinencio, "A Continuous-Time [sigma-delta symbols] Modulator With 88-dB Dynamic Range and 1.1-MHz Signal Bandwidth", IEEE Journal of Solid-State Circuits, vol. 39, No. 1, Jan. 2004, pp. 75-86.

* cited by examiner

DELTA SIGMA MODULATOR FOR SHAPING NOISE AND AUDIO CODEC HAVING THE SAME

CROSS-REFERENCE TO RELATED APPLICATION

This application claims priority under 35 U.S.C. §119 to Korean Patent Application No. 10-2015-0101773 filed on Jul. 17, 2015, the entire contents of which are incorporated herein by reference in their entirety.

BACKGROUND

Field

The inventive concepts described herein relate to a delta-sigma modulator, and more particularly, relate to a delta-sigma modulator capable of noise-shaping and an audio codec having the same.

Description of Related Art

Delta-sigma modulators are commonly employed in a high-resolution data converter through quantization noise suppression using a noise-shaping characteristic of quantization noise and an oversampling method.

An analog delta-sigma modulator used in a high-resolution analog-to-digital converter may be classified into a discrete-time method using a switched-capacitor integrator according to a configuration method of a loop filter and a continuous-time method using an active filter including resistors and capacitors.

The delta-sigma modulator may adapt an active filter as a loop filter. The delta-sigma modulator may minimize quantization noise necessarily generated in a step for converting an analog signal into a digital signal. Moreover, the delta-sigma modulator may be widely used as an analog-to-digital converter. The delta-sigma modulator is classified into a discrete-time delta-sigma modulator and a continuous-time delta sigma modulator according to a type of a loop filter.

The discrete-time delta-sigma modulator has the characteristic that the variation of a filter coefficient is relatively small and the expendability of a frequency is enhanced, using a switched-capacitor circuit. The discrete-time delta-sigma modulator also has other characteristic that power consumption is large, a switching noise occurs in an input terminal, and an anti-aliasing filter is additionally used for minimizing an aliasing generated when a high-resolution signal is changed into a low-resolution signal.

On the other hand, the continuous-time delta sigma modulator provides a unique anti-aliasing function, and has a characteristic that a filter characteristic is changed based on the variation of a passive component according to a process variation, a temperature, and the like.

SUMMARY

Embodiments of the inventive concepts provide a delta-sigma modulator capable of shaping noise caused by a clock jitter.

Other embodiments of the inventive concepts provide an audio codec having the delta-sigma modulator.

The inventive concept is not limited to the above disclosure, and other embodiments may become apparent to those of ordinary skill in the art based on the following descriptions.

In accordance with one aspect of the inventive concepts, a delta-sigma modulator includes a loop filter, a quantizer configured to convert an analog output signal into a digital signal, and a digital-to-analog converter (DAC) configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and the second capacitor is discharged and generates a charge corresponding to the noise. In a next first sampling period, the first capacitor is discharged, and at the same time, the second capacitor generates a noise current corresponding to the noise using the charge and is charged with the reference voltage. In an embodiment, the DAC may supply a reference current having a constant magnitude to the loop filter for the first sampling period and the second sampling period.

In another embodiment, the DAC may supply the reference current to the loop filter, and at the same time, the DAC may supply the noise current to the loop filter. A direction of each of the noise current and the reference current is determined according to the noise.

In still another embodiment, the DAC may include a first current source connected between a first node and a third node, a first switch connected between a second node and a fourth node and activated in response to a first control signal for a second sampling period, a second switch connected between the third node and the fourth node and activated for a first sampling period, a first capacitor connected between the fourth node and a fifth node, a third switch connected between the fourth node and a sixth node and activated in response to the first control signal for the second sampling period, a fourth switch connected between the fifth node and the sixth node and activated in response to the first control signal for the second sampling period, a fifth switch connected between a seventh node and an eighth node and activated in response to the first control signal for the second sampling period, a sixth switch connected between the third node and the eighth node and activated for the second sampling period, a second capacitor connected between the eighth node and a ninth node, a seventh switch connected between the eighth node and a tenth node and activated in response to the first control signal for the first sampling period, an eighth switch connected between the tenth node and an eleventh node and activated in response to the first control signal for the first sampling period, a ninth switch connected between the ninth node and the tenth node and activated in response to the second control signal for the first sampling period, a tenth switch connected between the tenth node and a twelfth node and activated in response to the second control signal for the first sampling period, an eleventh switch connected between the eleventh node and a thirteenth node and activated for the second sampling period, a third capacitor connected between the eleventh node and the twelfth node, a twelfth switch connected between the eleventh node and a fourteenth node and activated in response to the second control signal for the first sampling period, a thirteenth switch connected between a fifteenth node and a sixteenth node and activated in response to the first control signal for the second sampling period, a fourteenth switch connected between the fifteenth node and a seventeenth node and activated in response to the second control signal for the second sampling period, a fifteenth switch connected between the thirteenth node and the sixteenth node and activated for the first sampling period, a fourth capacitor connected between the sixteenth node and the seventeenth node, a sixteenth switch connected between the sixteenth node and a nineteenth node and activated in response to the second control signal for the second sampling period, and a second current source connected between the thirteenth node and an eighteenth node.

In yet another embodiment, the DAC may further include a seventeenth switch connected between the fifth node and a twentieth node, an eighteenth switch connected between the seventeenth node and the twentieth node, a nineteenth switch connected between the ninth node and the twentieth node, a twentieth switch connected between the twelfth node and the twentieth node, a 21st switch connected between the ninth node and a 21st node, a 22nd switch connected between the twelfth node and the 21st node, a 23rd switch connected between the fifth node and the 21st node, and a 24th switch connected between the seventeenth node and the 21st node. The seventeenth switch may be activated when a current digital data signal is in a high state for the first sampling period or when a previous digital data signal is in a high state for the second sampling period, and the first control signal is activated. The eighteenth switch may be activated when the current digital data signal is in a low state for the first sampling period, or when the previous digital data signal is in a low state for the second sampling period and the first control signal is activated. The nineteenth switch may be activated when the current digital data signal is in a high state for the second sampling period, or when the previous digital data signal is in a high state for the first sampling period and the first control signal is activated. The twentieth switch may be activated when the current digital data signal is in a low state for the second sampling period, or when the previous digital data signal is in a low state for the first sampling period and the first control signal is activated. The 21st switch may be activated when the current digital data signal is in a low state for the second sampling period, or when the previous digital data signal is in a low state for the first sampling period and the first control signal is activated. The 22nd switch may be activated when the current digital data signal is in a high state for the second sampling period, or when the previous digital data signal is in a high state for the first sampling period and the first control signal is activated. The 23rd switch may be activated when the current digital data signal is in a low state for the first sampling period, or when the previous digital data signal is in a low state for the second sampling period and the first control signal is activated. The 24th switch may be activated when the current digital data signal is in a high state for the first sampling period, or when the previous digital data signal is in a high state for the second sampling period and the first control signal is activated.

In yet another embodiment, each of the twentieth node and the 21st node may be connected to virtual ground nodes of an operational amplifier in the loop filter, and the virtual ground nodes are connected to an inverting input port and a non-inverting input port, respectively.

In yet another embodiment, the delta-sigma modulator may further include a two-phase clock generator configured to generate the first sampling period, the second sampling period, the first control signal, and the second control signal.

In yet another embodiment, the quantizer may transmit the current digital data signal and the previous digital data signal to the DAC.

In yet another embodiment, the DAC may include a differential structure, and the first current source and the second current source may be implemented with one current source.

In yet another embodiment, a power voltage may be applied to the first node, a voltage which is resulted by subtracting a reference voltage from a common voltage is applied to the second node, the common voltage is applied to the sixth node, a voltage which is resulted by subtracting the reference voltage from the common voltage is applied to the seventh node, the common voltage is applied to the tenth node, a voltage which is resulted by subtracting the reference voltage from the common voltage is applied to the seventh node, a voltage which is resulted by adding the reference voltage to the common voltage is applied to the tenth node, the common voltage is applied to the fifteenth node, a ground voltage is applied to the eighteenth node, and a voltage which is resulted by adding the reference voltage to the common voltage is applied to the nineteenth node.

In accordance with another aspect of the inventive concept, an audio codec including a delta-sigma modulator. The delta-sigma modulator includes a loop filter, a quantizer configured to convert an analog output signal into a digital signal, and a DAC configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and at the same time, the second capacitor is discharged and generates a charge corresponding to the noise. In a next first sampling period, the first capacitor is discharged, and at the same time, the second capacitor generates a noise current corresponding to the noise using the charge and is charged with the reference voltage.

In an embodiment, the DAC may supply a reference current having a constant magnitude to the loop filter for the first sampling period and the second sampling period.

In another embodiment, the DAC may supply the reference current to the loop filter, and at the same time, the DAC may supply the noise current to the loop filter. A direction of each of the noise current and the reference current may be determined according to the noise.

In still another embodiment, the delta-sigma modulator may be included in a receiver in a wireless transceiver.

In yet another embodiment, the audio codec may be included in a system-on-chip or may be manufactured as one independent chip.

In accordance with still another aspect of the inventive concept, a system-on-chip includes an audio codec configured to process an audio signal using a delta-sigma modulator, and a clock generator configured to generate a signal for controlling the delta-sigma modulator. The delta-sigma modulator may include a loop filter, a quantizer configured to convert an analog output signal into a digital signal, and a DAC configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and the second capacitor is discharged and generates a charge corresponding to the noise. In a next first sampling period, the first capacitor is discharged, and at the same time, the second capacitor generates a noise current corresponding to the noise using the charge and is charged with the reference voltage.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1:
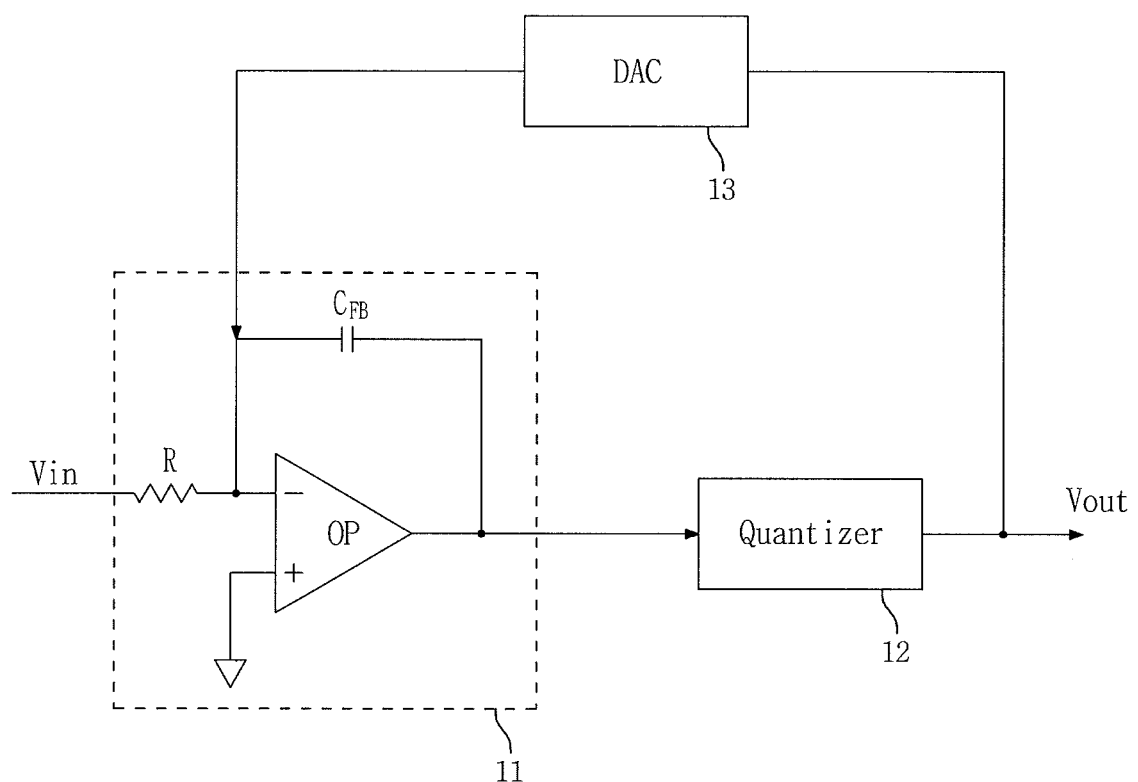
FIG. 1 is a circuit diagram illustrating a delta-sigma modulator according to a related art.

Example embodiments of the present disclosure are described below in sufficient detail to enable those of ordinary skill in the art to embody and practice the present disclosure. It is important to understand that the present disclosure may be embodied in many alternate forms and should not be construed as limited to the example embodiments set forth herein.

While the present disclosure is susceptible to various modifications and alternative forms, specific embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure.

It will be understood that, although the terms "first," "second," "A," "B," etc. may be used herein in reference to elements of the present disclosure, such elements should not be construed as being limited by these terms. For example, a first element could be termed a second element, and a second element could be termed a first element, without departing from the scope of the present disclosure. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the present disclosure is not intended to limit the scope of the present disclosure. The articles "a", "an", and "the" are singular in that they have a single referent, however the use of the singular form in the present document should not preclude the presence of more than one referent. In other words, elements of the present disclosure referred to as in singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this present disclosure belongs. It will be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Embodiments of the present inventive concept will be described below with reference to the attached drawings.

FIG. 1 is a circuit diagram illustrating a delta-sigma modulator according to a related art. Referring to FIG. 1, a delta-sigma modulator 10 according to the related art may include a loop filter 11, a quantizer 12, and a digital-to-analog converter (DAC) 13.

The loop filter 11 may filter an input signal Vin. In an embodiment, the loop filter 11 may include an operational amplifier OP, an input resistor R, and a feedback capacitor $C_{FB}$.

The input signal Vin may be applied to an inverting input port (−) of the operational amplifier OP through the input resistor R. A ground voltage VSS may be applied to a non-inverting input port (+) of the operational amplifier OP. The feedback capacitor $C_{FB}$ may be connected between an output port of the operational amplifier OP and the inverting input port (−) of the operational amplifier OP.

The quantizer 12 may quantize the filtered result received from the loop filter 11. The quantization may denote to change analog data into a discrete physical quantity. The quantizer 12 may output an output signal Vout which is a quantized result.

The DAC 13 may convert the output signal Vout into an analog signal. The DAC 13 may transmit the analog signal to the inverting input port (−) of the operational amplifier OP.

At this time, a jitter may be generated in the inverting input port (−) of the operational amplifier OP. For this reason, an integrated result of the loop filter 11 may include an error. The delta-sigma modulator according to the embodiment of the inventive concept may compensate the error caused by the jitter.

Figure 2:
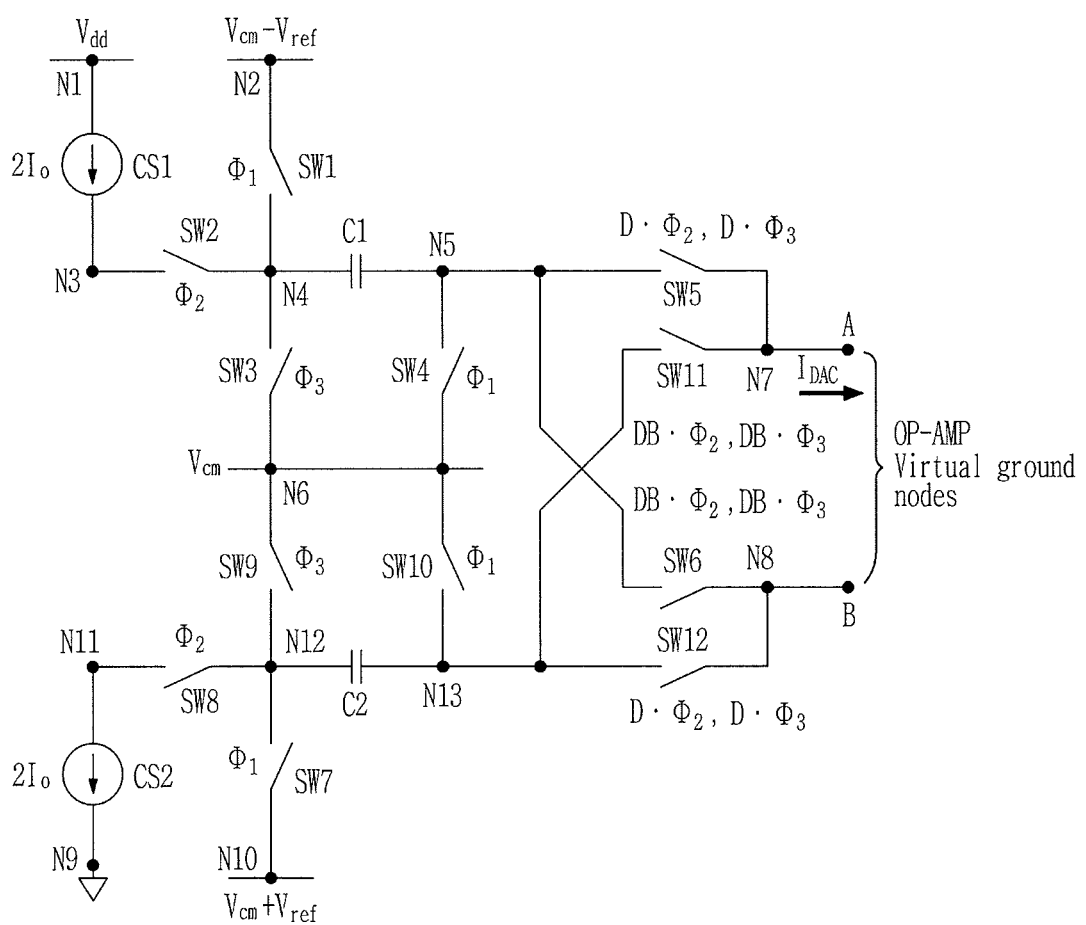
FIG. 2 is a circuit diagram illustrating a part of the delta-sigma modulator shown in FIG. 1 in detail.

FIG. 2 is a circuit diagram illustrating a part of the delta-sigma modulator shown in FIG. 1 in detail. Referring to FIGS. 1 and 2, the DAC 13 according to the related art may include a switched-capacitor return-to-zero DAC.

A power voltage Vdd may be applied to a first node N1. A voltage (i.e., Vcm−Vref) which is resulted by subtracting a reference voltage Vref from a common voltage Vcm may be applied to a second node N2.

A first current source CS1 may be connected between the first node N1 and a third node N3. In an embodiment, the first current source CS1 may provide a current of $2I_0$.

A first switch SW1 may be connected between the second node N2 and a fourth node N4. The first switch SW1 may be activated in response to a first control signal $\Phi 1$. A second switch SW2 may be connected between the third node N3 and the fourth node N4. The second switch SW2 may be activated in response to a second control signal $\Phi 2$.

A first capacitor C1 may be connected between the fourth node N4 and a fifth node N5. A third switch SW3 may be connected between the fourth node N4 and a sixth node N6. The third switch SW3 may be activated in response to a third control signal $\Phi 3$. A fourth switch SW4 may be connected between the fifth node N5 and the sixth node N6. The fourth switch SW4 may be activated in response to the first control signal $\Phi 1$.

The quantizer 12 may output digital data signal (e.g., D[n] or DB[n]) to the DAC 13. Here, D[n] means that the digital data signal is in a high state. DB[n] means that the digital data signal is in a low state.

A fifth switch SW5 may be connected between the fifth node N5 and a seventh node N7. When the digital data signal is in a high state and the second control signal $\Phi 2$ is activated, or when the digital data signal is in a high state and the third control signal $\Phi 3$ is activated, the fifth switch SW5 may be activated. A sixth switch SW6 may be connected between the fifth node N5 and an eighth node N8. When the digital data signal is in a low state and the second control signal $\Phi 2$ is activated, or when the digital data signal is in a low state and the third control signal $\Phi 3$ is activated, the sixth switch SW6 may be activated.

The ground voltage VSS may be applied to a ninth node N9. A voltage (i.e., Vcm+Vref) which is resulted by adding the reference voltage Vref to the common voltage Vcm may be applied to a tenth node N10. A seventh switch SW7 may be connected between the tenth node N10 and a twelfth node N12. The seventh switch SW7 may be activated in response to the first control signal $\Phi 1$.

A second current source CS2 may be connected between the ninth node N9 and an eleventh node N11. In an embodiment, the second current source CS2 may provide a current of $2I_0$.

An eighth switch SW8 may be connected between the eleventh node N11 and the twelfth node N12. An eighth switch SW8 may be activated in response to the second control signal $\Phi 2$. A second capacitor C2 may be connected between the twelfth node N12 and a thirteenth node N13. A second capacitor C2 may be connected between the twelfth node N12 and a thirteenth node N13.

A ninth switch SW9 may be connected between the twelfth node N12 and the sixth node N6. The ninth switch SW9 may be activated in response to the third control signal $\Phi 3$. A tenth switch SW10 may be connected between the thirteenth node N13 and the sixth node N6. A tenth switch SW10 may be activated in response to the first control signal $\Phi 1$.

An eleventh switch SW11 may be connected between a thirteenth node N13 and the seventh node N7. When the digital data signal is in a low state and the second control signal $\Phi 2$ is activated, or when the digital data signal is in a low state and the third control signal $\Phi 3$ is activated, the eleventh switch SW11 may be activated. A twelfth switch SW12 may be connected between the thirteenth node N13 and the eighth node N8. When the digital data signal is in a high state and the second control signal $\Phi 2$ is activated, or when the digital data signal is in a high state and the third control signal $\Phi 3$ is activated, the twelfth switch SW12 may be activated.

Each of the seventh node N7 and the eighth node N8 may be connected to virtual ground nodes (i.e., A and B) of the operational amplifier OP in the loop filter 11. Each of the virtual ground nodes A and B may be connected to the inverting input port (−) and the non-inverting input port (+) of the operational amplifier OP.

The DAC 13 according to the related art may transmit a DAC current $I_{DAC}$ to the loop filter 11 through the seventh node N7 and the eighth node N8. An operation of the DAC 13 according to the related art may be described with reference to FIG. 3.

The DAC 13 may previously charge the first capacitor C1 and the second capacitor C2 for a quarter of a period T/4. Next, when there is a clock jitter in the DAC 13, the DAC 13 may charge the first capacitor C1 and the second capacitor C2 with charges caused by the clock jitter for a half of a period T/2. The DAC 13 may inversely charge the first capacitor C1 and the second capacitor C2 with additional charges caused by the clock jitter for the remaining quarter of a period T/4.

To generate a clock having a quarter of a period T/4, the DAC 13 according to the related art may require a clock having twice the sampling frequency fs (i.e., 1/T). Moreover, the DAC 13 according to the related art may require a high-efficient loop filter to integrate an input signal for a half of a period T/2.

Figure 3:
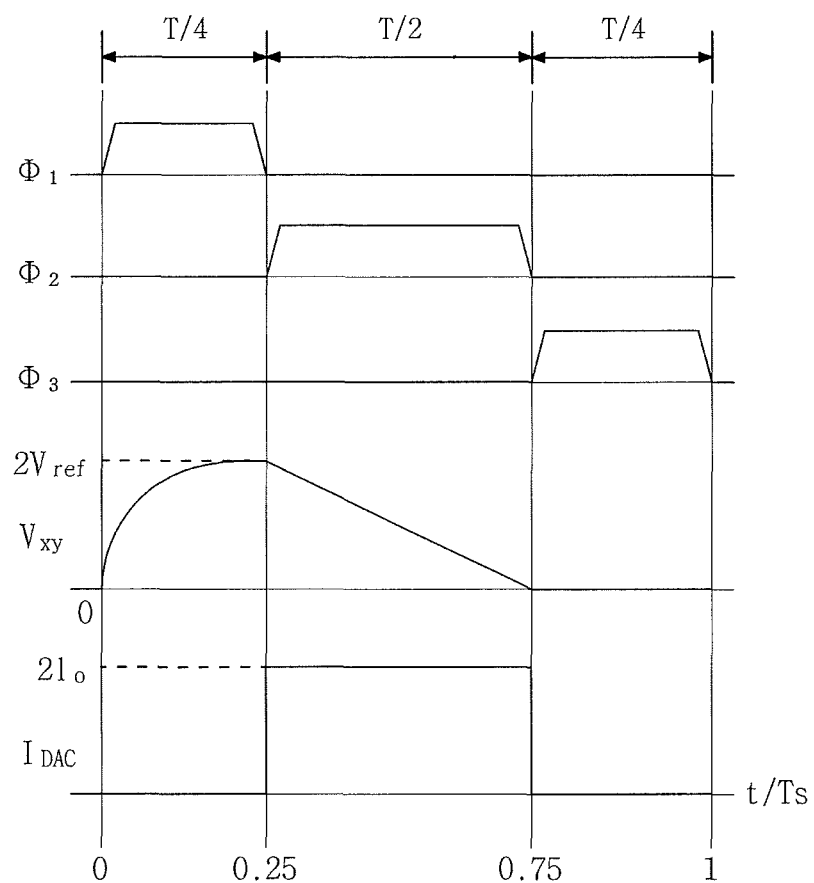
FIG. 3 is a timing diagram illustrating an operation of a digital-to-analog converter (DAC) shown in FIG. 2.

FIG. 3 is a timing diagram illustrating an operation of the DAC shown in FIG. 2. Referring to FIGS. 2 and 3, the sampling period T may include a first quarter of a period T/4, a half of a period T/2, and a second quarter of a period T/4.

In the first quarter of a period T/4, the first control signal $\Phi 1$ is activated. When the first control signal $\Phi 1$ is activated, each of the first switch SW1, the fourth switch SW4, the seventh switch SW7, and the tenth switch SW10 may be activated. At this time, the first capacitor C1 may be charged with a negative reference voltage −Vref. The second capacitor C2 may be charged with a positive reference voltage Vref. Moreover, the fourth node N4 is referred to as a node X and the twelfth node N12 is referred to as a node Y. An XY voltage Vxy between the node X and the node Y may increase from 0 V to 2Vref.

Next, in a half of a period T/2, the second control signal $\Phi 2$ is activated. When the second control signal $\Phi 2$ is activated, the second switch SW2 and the eighth switch SW8 may be activated. Moreover, when the second control signal $\Phi 2$ is activated, the fifth switch SW5 or the sixth switch SW6 may be activated according to the digital data (i.e., D or DB). Likewise, when the second control signal Φ2 is activated, the eleventh switch SW11 or the twelfth switch SW12 may be activated according to the digital data (i.e., D or DB).

At this time, each of the first capacitor C1 and second capacitor C2 may be discharged. Moreover, the XY voltage Vxy may be reduced from 2Vref to 0 V. The DAC current $I_{DAC}$ by the current source SC flows in each of the seventh node N7 and the eighth node N8. A magnitude of the DAC current $I_{DAC}$ may be a current of $2I_0$.

Finally, in the second quarter of a period T/4, the third control signal Φ3 is activated. When third control signal Φ3 is activated, the third switch SW3 and the ninth switch SW9 may be activated. Moreover, when the third control signal Φ3 is activated, the fifth switch SW5 or the sixth switch SW6 may be activated according to the digital data (i.e., D or DB). Likewise, when the third control signal Φ3 is activated, the eleventh switch SW11 or the twelfth switch SW12 may be activated according to the digital data (i.e., D or DB).

At this time, the XY voltage Vxy may be 0 V. When the XY voltage Vxy is not 0 V due to a clock jitter, the first capacitor C1 may be charged to a voltage level of the fourth node N4 and the second capacitor C2 may be charged to a voltage level of the twelfth node N12. The DAC 13 may transmit a current in a direction opposite the DAC current $I_{DAC}$ for the second quarter of a period T/4. This will be described with reference to FIG. 5 in detail.

Figure 4:
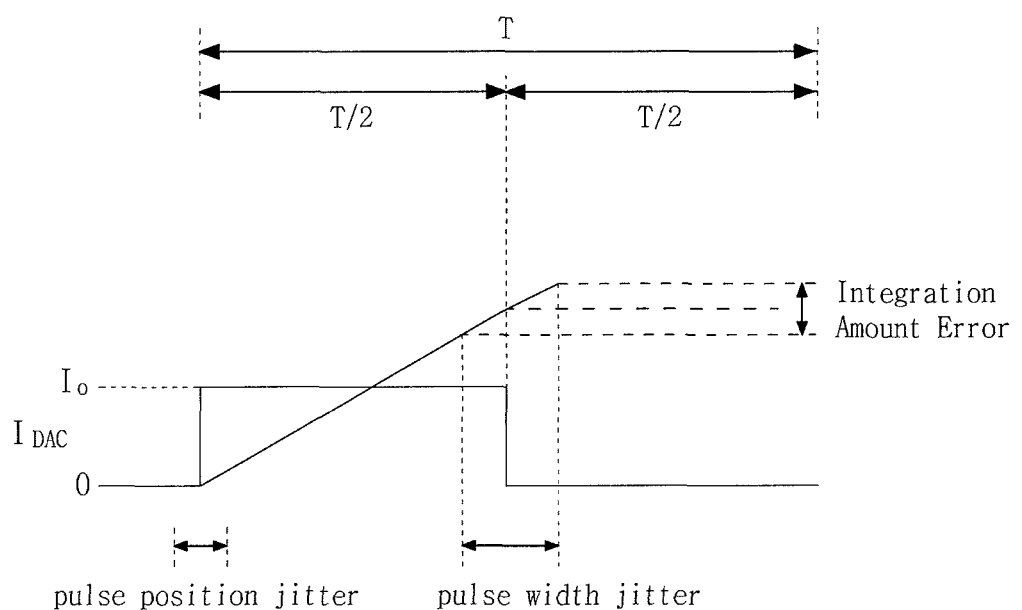
FIG. 4 is a timing diagram for describing an operation of the loop filter when a jitter occurs in the DAC shown in FIG. 2.

FIG. 4 is a timing diagram for describing an operation of the loop filter when a jitter occurs in the DAC shown in FIG. 2. Referring to FIGS. 1, 2, and 4, the quantizer 12 may generate a digital signal. Here, the digital signal may include a jitter. For this reason, the DAC 13 may be affected by the jitter. The jitter may include a pulse position jitter and a pulse width jitter.

In the sampling period T, the DAC 13 may transmit the DAC current $I_{DAC}$ to the loop filter 11. In detail, the DAC 13 may transmit the DAC current $I_{DAC}$ of $I_0$ to the loop filter 11 for the first half of a period T/2.

Here, the DAC 13 may perform an integration operation on the DAC current $I_{DAC}$ using the first capacitor C1 and the second capacitor C2. When a pulse width jitter occurs in an integration operation, an amount of integration may include an error. Here, the integration operation may include an operation in which the first capacitor C1 or the second capacitor C2 is further charged or further discharged due to charges caused by the jitter.

Furthermore, the DAC 13 may perform an integration operation on the DAC current $I_{DAC}$ corresponding to 0 using the first capacitor C1 and the second capacitor C2 for the second half of a period T/2. Here, when there is not a pulse width jitter, an amount of integration may be zero. A method for solving an error caused by a pulse width jitter may be described with reference to FIG. 5 in detail.

Figure 5:
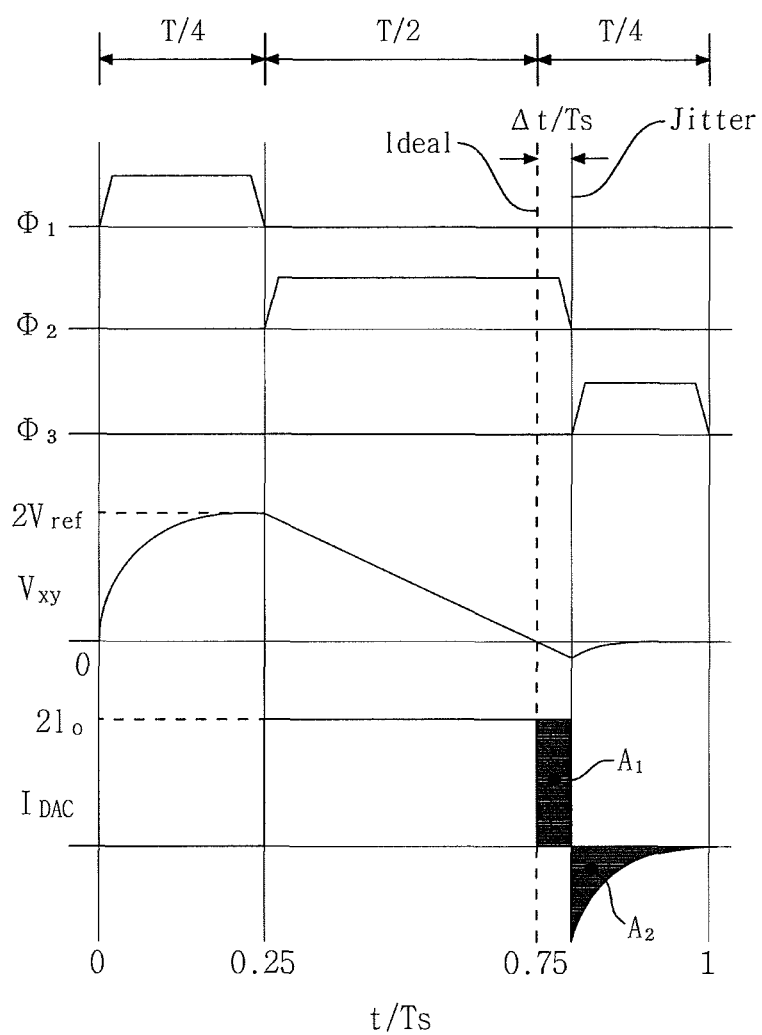
FIG. 5 is a timing diagram illustrating an operation of the DAC when jitter occurs in the DAC shown in FIG. 2.

FIG. 5 is a timing diagram illustrating an operation of the DAC when a jitter occurs in the DAC shown in FIG. 2. Referring to FIGS. 2 and 5, the first control signal Φ1 is activated for the first quarter of a period T/4. When the first control signal Φ1 is activated, each of the first switch SW1, the fourth switch SW4, the seventh switch SW7, and the tenth switch SW10 may be activated. At this time, the first capacitor C1 may be charged with a negative reference voltage −Vref. The second capacitor C2 may be charged with a reference voltage Vref. Moreover, when the fourth node N4 is referred to as a node X, and the twelfth node N12 is referred to as a node Y, an XY voltage Vxy may increase from 0 V to 2Vref.

Next, the second control signal Φ2 is activated for a half of a period T/2. When the second control signal Φ2 is activated, the second switch SW2 and the eighth switch SW8 may be activated. Moreover, when the second control signal Φ2 is activated, the fifth switch SW5 or the sixth switch SW6 may be activated according to the digital data (i.e., D or DB). Likewise, when the second control signal Φ2 is activated, the eleventh switch SW11 or the twelfth switch SW12 may be activated according to the digital data (i.e., D or DB). At this time, each of the first capacitor C1 and the second capacitor C2 may be discharged.

Meanwhile, the quantizer 12 may transmit a digital signal including a jitter to the DAC 13. Accordingly, the DAC 13 may include an error in an integration operation. In a half of a period T/2, the DAC 13 may transmit the DAC current $I_{DAC}$ corresponding to a current of $2I_0$ to the loop filter 11. In detail, in a half of a period T/2, the DAC 13 may transmit the DAC current $I_{DAC}$ corresponding to the current of $2I_0$ to the loop filter 11.

Here, the DAC 13 may perform an integration operation with respect to the DAC current $I_{DAC}$ corresponding to the current of $2I_0$ using the first capacitor C1 and the second capacitor C2. When a jitter occurs in an integration operation, an amount of integration may include an error. For example, the DAC 13 may perform an integration operation on the DAC current $I_{DAC}$ using the first capacitor C1 and the second capacitor C2, additionally for as much as A1 area.

On the other hand, when there is not a jitter, the XY voltage Vxy may be reduced from 2Vref to 0 V. However, the XY voltage Vxy may be lower than 0 V due to an influence of a jitter. At this time, the first capacitor C1 may be charged to a voltage level of the fourth node N4 and the second capacitor C2 may be charged to a voltage level of the twelfth node N12. The DAC current $I_{DAC}$ flows in each of the seventh node N7 and the eighth node N8 by the current source SC. The magnitude of the DAC current $I_{DAC}$ may be a current of $2I_0$. Moreover, the DAC 13 may additionally transmit a current corresponding to A1 area to the loop filter 11.

Finally, in the second quarter of a period T/4, the third control signal Φ3 is activated. When the third control signal Φ3 is activated, the third switch SW3 and the ninth switch SW9 may be activated. Moreover, when the third control signal Φ3 is activated, the fifth switch SW5 or the sixth switch SW6 may be activated according to the digital data (i.e., D or DB). Likewise, when the third control signal Φ3 is activated, the eleventh switch SW11 or the twelfth switch SW12 may be activated according to the digital data (i.e., D or DB).

Here, when there is not an influence of a jitter, the XY voltage Vxy may be a common voltage Vcm. However, when the XY voltage Vxy is not the common voltage Vcm due to a clock jitter, each of the first capacitor C1 and the second capacitor C2 may be discharged and may generate a current corresponding to an area A2.

In the second quarter of a period T/4, the DAC 13 may transmit a current corresponding to the area A2 to the loop filter 11 using the first capacitor C1 and the second capacitor C2. That is, the DAC 13 may inversely perform an integration operation on the current using the first capacitor C1 and the second capacitor C2 as much as the area A2. Accordingly, the delta-sigma modulator 10 according to the related art may remove or reduce a noise by a jitter.

Here, the delta-sigma modulator 10 according to the related art may have a clock having twice the sampling frequency to set a quarter of a sampling period T/4. The DAC current $I_{DAC}$ is $2I_0$ for a half of a sampling period T/2. Accordingly, the delta-sigma modulator 10 may include a high-efficiency loop filter 11.

Figure 6:
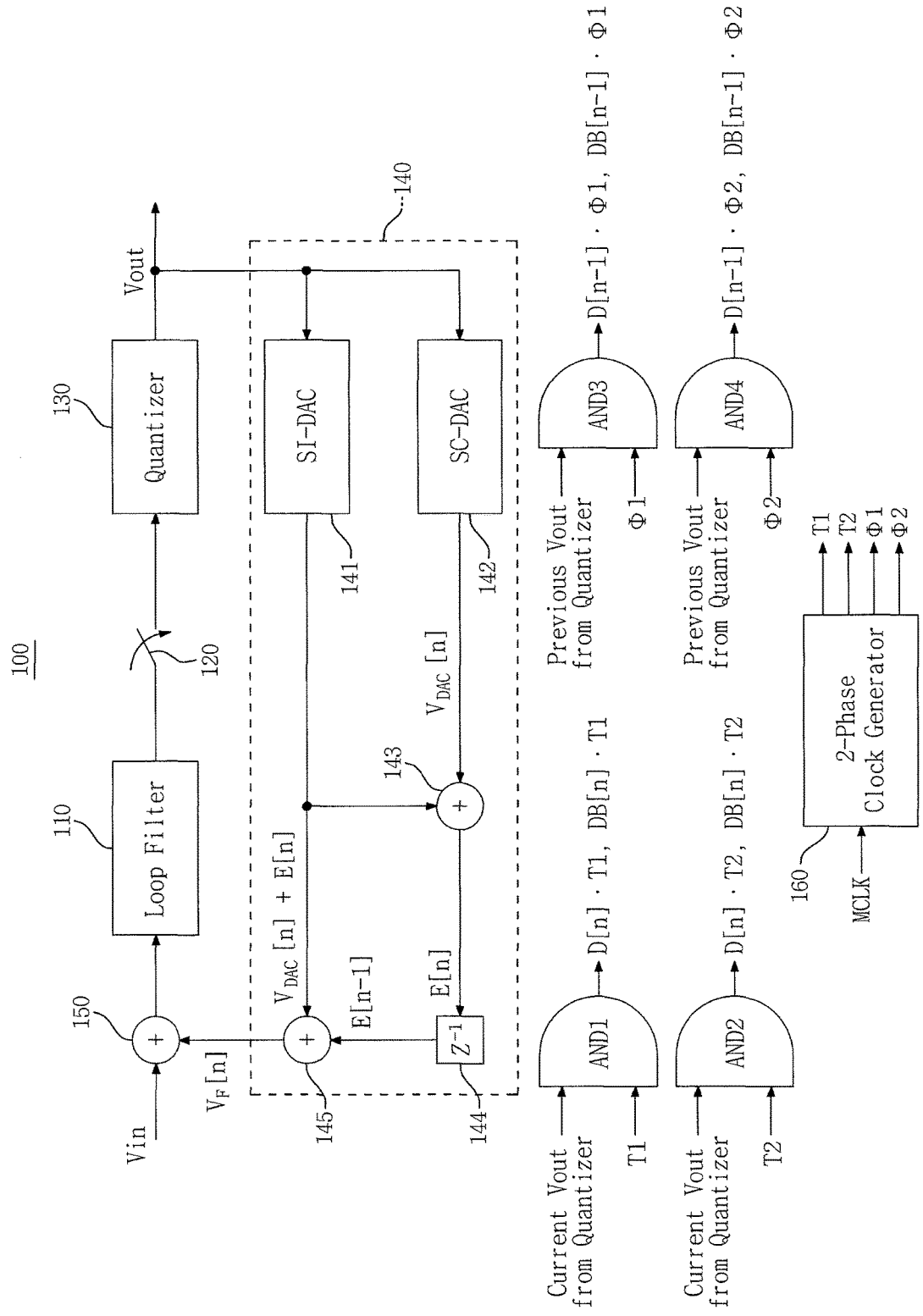
FIG. 6 is a block diagram illustrating a delta-sigma modulator according to an embodiment of the inventive concept.

FIG. 6 is a block diagram illustrating a delta-sigma modulator according to an embodiment of the inventive concept. Referring to FIG. 6, the delta-sigma modulator 100 according to the embodiment of the inventive concept may shape noise caused by a pulse-width jitter.

The delta-sigma modulator 100 may include a loop filter 110, a switch 120, a quantizer 130, a DAC 140, and an adder 150.

The loop filter 110 may include the same function as that of the loop filter 11 shown in FIG. 1. For example, the loop filter 110 may be an integrator including an operational amplifier, a resistor, and a capacitor.

The switch 120 may operate based on a sampling period. The loop filter 110 may transmit an output of the loop filter 110 to the quantizer 130 through the switch 120.

The quantizer 130 may include the same function as that of the quantizer 12 shown in FIG. 1. The quantizer 130 may output an output signal Vout which is the digital signal.

The DAC 140 may include a switched-current DAC (SI-DAC) 141, a switched-capacitor DAC (SC-DAC) 142, a first DAC adder 143, a one-cycle delay unit 144, and a second DAC adder 145.

The SI-DAC 141 may receive the output signal Vout from the quantizer 130. The SI-DAC 141 may generate a DAC output signal VDAC[n] using the output signal Vout. However, the SI-DAC 141 may be affected by a jitter. Accordingly, the SI-DAC 141 may include an error Ej[n] in the DAC output signal VDAC[n]. That is, the SI-DAC 141 may generate a first DAC output signal $V_{DAC}[n]+E_j[n]$.

Because the SC-DAC 142 samples a constant digital data signal with respect to a clock cycle, the SC-DAC 142 is a voltage sampling circuit in which a clock jitter is very small. Moreover, the SC-DAC 142 may receive an output signal Vout from the quantizer 130. The SC-DAC 142 may generate the DAC output signal $V_{DAC}[n]$ using the output signal Vout.

The first DAC adder 143 may subtract the second DAC output signal $V_{DAC}[n]$, which is transmitted from the SC-DAC 142, from the first DAC output signal $V_{DAC}[n]+E[n]$, which is transmitted from the SI-DAC 141. That is, the first DAC adder 143 may transmit a current error signal E[n] to the one-cycle delay unit 144.

The one-cycle delay unit 144 may delay a signal during one cycle. That is, the one-cycle delay unit 144 may receive the current error signal E[n] from the first DAC adder 143, and may generate a previous error signal E[n−1]. The one-cycle delay unit 144 may transmit the previous error signal E[n−1] to the second DAC adder 145.

The second DAC adder 145 may subtract the second DAC output signal $V_{DAC}[n]$, which is transmitted from the SC-DAC 142, from the first DAC output signal $V_{DAC}[n]+E[n]$, which is transmitted from the SI-DAC 141. Accordingly, an output signal $V_F[n]$ of the second DAC adder 145 corresponds to Equation 1.

$$V_F[n]=V_{DAC}[n]+E[n]-E[n-1]$$ [Equation 1]

According to Equation 1, the current error signal E[n] may be equal to the previous error signal E[n−1] in a low-frequency band. Accordingly, an output signal $V_F[n]$ of the second DAC adder 145 may be equal to the second DAC output signal $V_{DAC}[n]$. The DAC 140 according to the embodiment of the inventive concept may be described with reference to FIG. 7 in detail.

The delta-sigma modulator 100 according to the embodiment of the inventive concept may include a characteristic of a high-pass filter for removing a low-frequency wave.

The adder 150 may receive an input signal Vin and the output signal $V_F[n]$ of the second DAC adder 145. The adder 150 may subtract the output signal $V_F[n]$ of the second DAC adder 145 from the input signal Vin. The adder 150 may transmit the subtracted result to the loop filter 110.

Moreover, the delta-sigma modulator 100 according to the embodiment of the inventive concept may further include a 2-phase clock generator 160, a first AND gate AND1, a second AND gate AND2, a third AND gate AND3, and a fourth AND gate AND4.

The 2-phase clock generator 160 may receive a master clock MCLK and may generate a signal T1, a signal T2, the first control signal Φ1, and the second control signal Φ2 for controlling the DAC 140. Each of the signal T1, the signal T2, the first control signal Φ1, and the second control signal Φ2 may be described with reference to FIG. 7.

The first AND gate AND1 may perform a Boolean AND operation on the signal T1 and a current output signal Vout (i.e., D[n]) of the quantizer 130. The first AND gate AND1 may generate D[n]·T1 signal or DB[n]·T1 signal.

The second AND gate AND2 may perform a Boolean AND operation on the signal T2 and the current output signal Vout (i.e., D[n]) of the quantizer 130. The second AND gate AND2 may generate D[n]·T2 signal or DB[n]·T2 signal.

The third AND gate AND3 may perform a Boolean AND operation on the first control signal Φ1 and a previous output signal Vout (i.e., D[n−1]) of the quantizer 130. The third AND gate AND3 may generate D[n−1]·Φ1 signal or DB[n−1]·Φ1 signal.

The fourth AND gate AND4 may perform a Boolean AND operation with respect to the second control signal Φ2 and the previous output signal Vout (i.e., D[n−1]) of the quantizer 130. The fourth AND gate AND4 may generate D[n−1]·Φ2 signal or DB[n−1]·Φ2 signal.

Each of D[n]·signal T1, DB[n]·signal T1, D[n]·signal T2, DB[n]·signal T2, D[n−1]·Φ1 signal, DB[n−1]·Φ1 signal, D[n−1]·Φ2 signal, and DB[n−1]·Φ2 signal may be described with reference to FIG. 7.

The delta-sigma modulator 100 according to the embodiment of the inventive concept may be implemented with an audio CODEC. In an embodiment, the audio CODEC may be implemented with one functional block. Moreover, the audio CODEC may be implemented with one independent chip.

Moreover, the delta-sigma modulator 100 according to the embodiment of the inventive concept may be implemented with a receiver. For example, a MODEM may include a transceiver. The transceiver may include the delta-sigma modulator 100.

Components of the DAC 140 may be a functionally implemented embodiment. Accordingly, the DAC 140 may include additional components.

Figure 7:
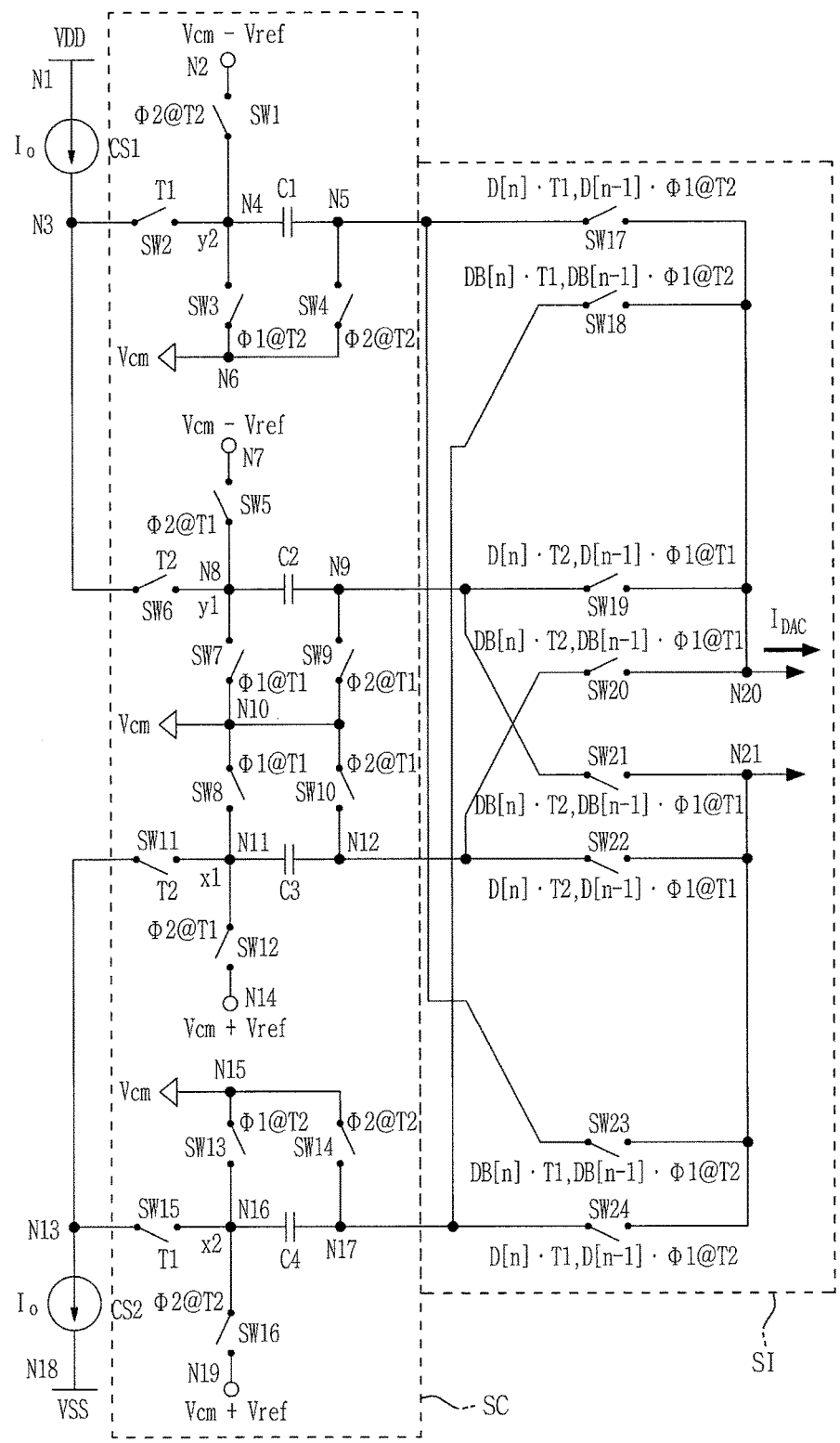
FIG. 7 is a circuit diagram illustrating a DAC according to another embodiment of the inventive concept.

FIG. 7 is a circuit diagram illustrating a DAC according to another embodiment of the inventive concept. Referring to FIG. 7, a first part SI which receives a digital data signal from the quantizer 130 illustrated in FIG. 6 and includes an error caused by a jitter may correspond to the SI-DAC 141. Moreover, a second part SC which receives the digital data signal from the quantizer 130 illustrated in FIG. 6 and does not include the error may correspond to the SC-DAC 142.

An operation of the DAC 200 may be described with reference to FIGS. 8A to 8D and 9 in detail.

The DAC 200 may include at least one capacitor charged and discharged with a reference voltage.

After the capacitor is charged with the reference voltage, the DAC 200 may transmit a constant current to a loop filter while discharging the capacitor. When there is not a jitter, a period for discharging the capacitor may be predetermined. Accordingly, when there is not a jitter, an amount of a current to be transmitted to the loop filter may be predetermined. That is, the DAC 200 may perform an integration operation on an amount of the current transmitted to the loop filter.

Referring to FIG. 7, a power voltage Vdd may be applied to a first node N1. A voltage (i.e., Vcm−Vref) which is resulted by subtracting the reference voltage Vref from the common voltage Vcm may be applied to a second node N2.

A first current source CS1 may be connected between the first node N1 and a third node N3. In an embodiment, the first current source CS1 may provide a current of $I_0$. A first switch SW1 may be connected between the second node N2 and a fourth node N4. The first switch SW1 may be activated in response to the second control signal $\Phi 2$ for the second sample period T2. A second switch SW2 may be connected between the third node N3 and the fourth node N4. The second switch SW2 may be activated for the first sample period T1.

A first capacitor C1 may be connected between the fourth node N4 and a fifth node N5. A third switch SW3 may be connected between the fourth node N4 and a sixth node N6. The third switch SW3 may be activated in response to the first control signal $\Phi 1$ for the second sample period T2. A fourth switch SW4 may be connected between the fifth node N5 and the sixth node N6. The fourth switch SW4 may be activated in response to the second control signal $\Phi 2$ for the second sample period T2.

The common voltage Vcm may be applied to the sixth node N6. A voltage (i.e., Vcm−Vref) which is resulted by subtracting the reference voltage Vref from the common voltage Vcm may be applied to a seventh node N7. A fifth switch SW5 may be connected between a seventh node N7 and an eighth node N8. The fifth switch SW5 may be activated in response to the second control signal $\Phi 2$ for the first sample period T1. A sixth switch SW6 may be connected between a third node N3 and an eighth node N8. The sixth switch SW6 may be activated for the second sample period T2.

A second capacitor C2 may be connected between the eighth node N8 and a ninth node N9. The common voltage Vcm may be applied to a tenth node N10. A seventh switch SW7 may be connected between the eighth node N8 and the tenth node N10. The seventh switch SW7 may be activated in response to the first control signal $\Phi 1$ for the first sample period T1. An eighth switch SW8 may be connected between the tenth node N10 and an eleventh node N11. The eighth switch SW8 may be activated in response to the first control signal $\Phi 1$ for the first sample period T1.

A ninth switch SW9 may be connected between the ninth node N9 and the tenth node N10. The ninth switch SW9 may be activated in response to the second control signal $\Phi 2$ for the first sample period T1. A tenth switch SW10 may be connected between the tenth node N10 and a twelfth node N12. The tenth switch SW10 may be activated in response to the second control signal $\Phi 2$ for the first sample period T1. An eleventh switch SW11 may be connected between the eleventh node N11 and a thirteenth node N13. The eleventh switch SW11 may be activated for the second sample period T2.

A third capacitor C3 may be connected between the eleventh node N11 and the twelfth node N12. A twelfth switch SW12 may be connected between the eleventh node N11 and a fourteenth node N14. The twelfth switch SW12 may be activated in response to the second control signal $\Phi 2$ for the first sample period T1. A voltage (i.e., Vcm+Vref) which is resulted by adding the reference voltage Vref to the common voltage Vcm may be applied to the fourteenth node N14. The common voltage Vcm may be applied to a fifteenth node N15.

A thirteenth switch SW13 may be connected between the fifteenth node N15 and a sixteenth node N16. The thirteenth switch SW13 may be activated in response to the first control signal $\Phi 1$ for the second sample period T2. A fourteenth switch SW14 may be connected between the fifteenth node N15 and a seventeenth node N17. The fourteenth switch SW14 may be activated in response to the second control signal $\Phi 2$ for the second sample period T2. A fifteenth switch SW15 may be connected between the thirteenth node N13 and the sixteenth node N16. The fifteenth switch SW15 may be activated for the first sample period T1.

A fourth capacitor C4 may be connected between the sixteenth node N16 and a seventeenth node N17. A ground voltage VSS may be applied to an eighteenth node N18. A voltage (i.e., Vcm+Vref) which is resulted by adding the reference voltage Vref to the common voltage Vcm may be applied to the nineteenth node N19. A sixteenth switch SW16 may be connected between the sixteenth node N16 and a nineteenth node N19. The sixteenth switch SW16 may be activated in response to the second control signal $\Phi 2$ for the second sample period T2.

A second current source CS2 may be connected between the thirteenth node N13 and the eighteenth node N18. In an embodiment, the second current source CS2 may provide a current of $I_0$.

The DAC 200 according to the embodiment of the inventive concept may include a differential structure. Accordingly, the first current source CS1 and the second current source CS2 may be implemented with one current source.

A quantizer may output a current digital data signal (e.g., D[n] or DB[n]) and a previous digital data signal (e.g., D[n−1] or DB[n−1]) to the DAC 200. Here, D[n] means that the current digital data signal is in a high state. DB[n] means that the current digital data signal is in a low state. D[n−1] means that the previous digital data signal is in a high state. DB[n−1] means that the previous digital data signal is in a low state.

A seventeenth switch SW17 may be connected between the fifth node N5 and a twentieth node N20. When the current digital data signal is in a high state for the first sample period T1, the seventeenth switch SW17 may be activated. Moreover, when the previous digital data signal is in a high state and the first control signal $\Phi 1$ is activated for the second sample period T2, the seventeenth switch SW17 may be activated.

An eighteenth switch SW18 may be connected between the seventeenth node N17 and the twentieth node N20. When the current digital data signal is in a low state for the first sample period T1, the eighteenth switch SW18 may be activated. Moreover, when the previous digital data signal is in a low state and the first control signal $\Phi 1$ is activated for the second sample period T2, the eighteenth switch SW18 may be activated.

A nineteenth switch SW19 may be connected between a ninth node N9 and the twentieth node N20. When the current digital data signal is in a high state for the second sample period T2, the nineteenth switch SW19 may be activated. Moreover, when the previous digital data signal is in a high state and the first control signal Φ1 is activated for the first sample period T1, the nineteenth switch SW19 may be activated.

A twentieth switch SW20 may be connected between the twelfth node N12 and the twentieth node N20. When the current digital data signal is in a low state for the second sample period T2, the twentieth switch SW20 may be activated. Moreover, when the previous digital data signal is in a low state and the first control signal Φ1 is activated for the first sample period T1, the twentieth switch SW20 may be activated.

A 21st switch SW21 may be connected between the ninth node N9 and a 21st node N21. When the current digital data signal is in a low state for the second sample period T2, the 21st switch SW21 may be activated. Moreover, when the previous digital data signal is in a low state and the first control signal Φ1 is activated for the first sample period T1, the 21st switch SW21 may be activated.

A 22nd switch SW22 may be connected between the twelfth node N12 and the 21st node N21. When the current digital data signal is in a high state for the second sample period T2, the 22nd switch SW22 may be activated. Moreover, when the previous digital data signal is in a high state and the first control signal Φ1 is activated for the first sample period T1, the 22nd switch SW22 may be activated.

A 23rd switch SW23 may be connected between the seventeenth node N17 and the 21st node N21. When the current digital data signal is in a low state for the first sample period T1, the 23rd switch SW23 may be activated. Moreover, when the previous digital data signal is in a low state and the first control signal Φ1 is activated for the second sample period T2, the 23rd switch SW23 may be activated.

A 24th switch SW24 may be connected between the seventeenth node N17 and the 21st node N21. When the current digital data signal is in a high state for the first sample period T1, the 24th switch SW24 may be activated. Moreover, when the previous digital data signal is in a high state and the first control signal Φ1 is activated for the second sample period T2, the 24th switch SW24 may be activated.

For example, when a digital output of the quantizer 130 is in a high state, each of the seventeenth switch SW17, the nineteenth switch SW19, the 22nd switch SW22, and the 24th switch SW24 may be activated. On the other hand, when a digital output of the quantizer 130 is in a low state, each of the eighteenth switch SW18, the twentieth switch SW20, the 21st switch SW21, and the 23rd switch SW23 may be activated.

Each of the twentieth node N20 and the 21st node N21 may be connected to virtual ground nodes. The virtual ground nodes may be connected to the inverting input port (−) or the non-inverting input port (+) of the operational amplifier OP in the loop filter.

Figure 8A:
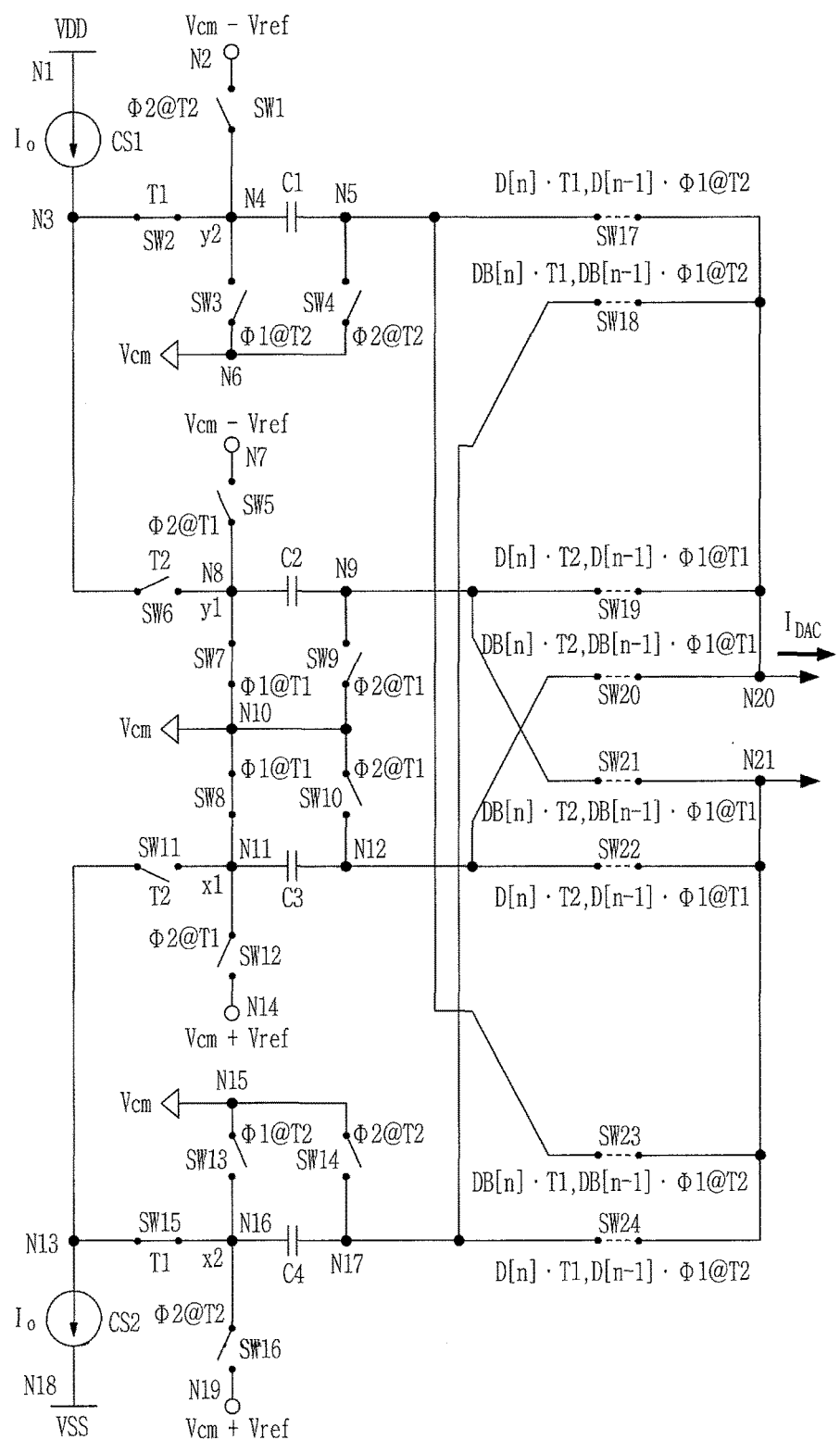
FIGS. 8a to 8d are circuit diagrams for describing an operation of the DAC shown in FIG. 7.

FIGS. 8a to 8d are circuit diagrams for describing an operation of the DAC shown in FIG. 7. Referring to FIG. 8a, in the first sampling period T1, the first control signal Φ1 may be activated. At this time, the second switch SW2, the seventh switch SW7, the eighth switch SW8, and the fifteenth switch SW15 may be activated.

When a current digital data signal (e.g., D[n] or DB[n]) is in a high state, the seventeenth switch SW17 and the 23rd switch SW23 may be activated. Otherwise, the eighteenth switch SW18 and the 24th switch SW24 may be activated.

Moreover, when a previous digital data signal (i.e., D[n−1] or DB[n−1]) is in a high state, the nineteenth switch SW19 and the 21st switch SW21 may be activated. Otherwise, the twentieth switch SW20 and the 22nd switch SW22 may be activated.

Figure 8B:
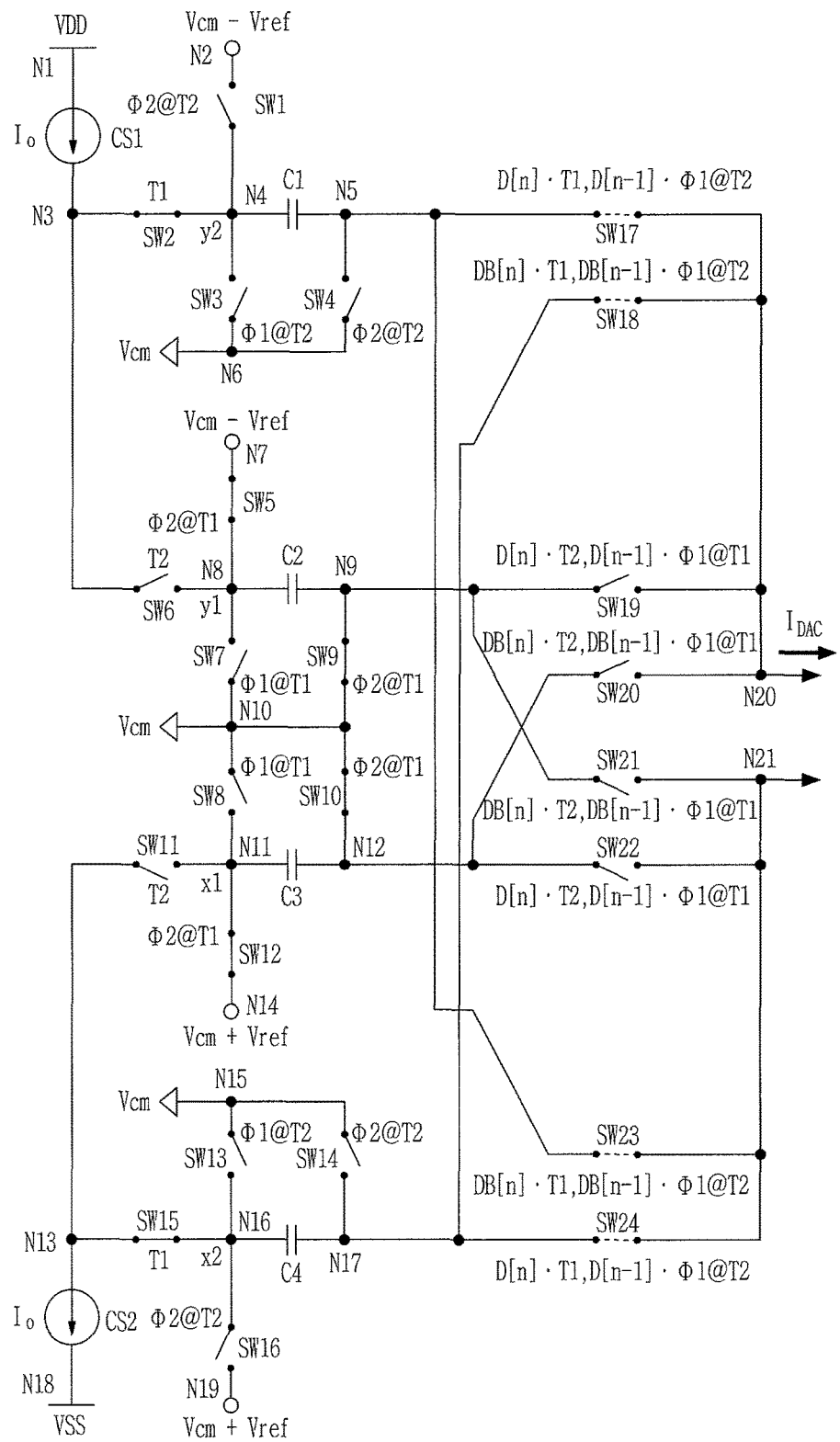

Referring to FIG. 8b, in the first sampling period T1, the second control signal Φ2 may be activated. At this time, the second switch SW2, the fifth switch SW5, the ninth switch SW9, the tenth switch SW10, the twelfth switch SW12, and the fifteenth switch SW15 may be activated.

When a current digital data signal (e.g., D[n] or DB[n]) is in a high state, the seventeenth switch SW17 and the 23rd switch SW23 may be activated. Otherwise, eighteenth switch SW18 and the 24th switch SW24 may be activated.

Figure 8C:
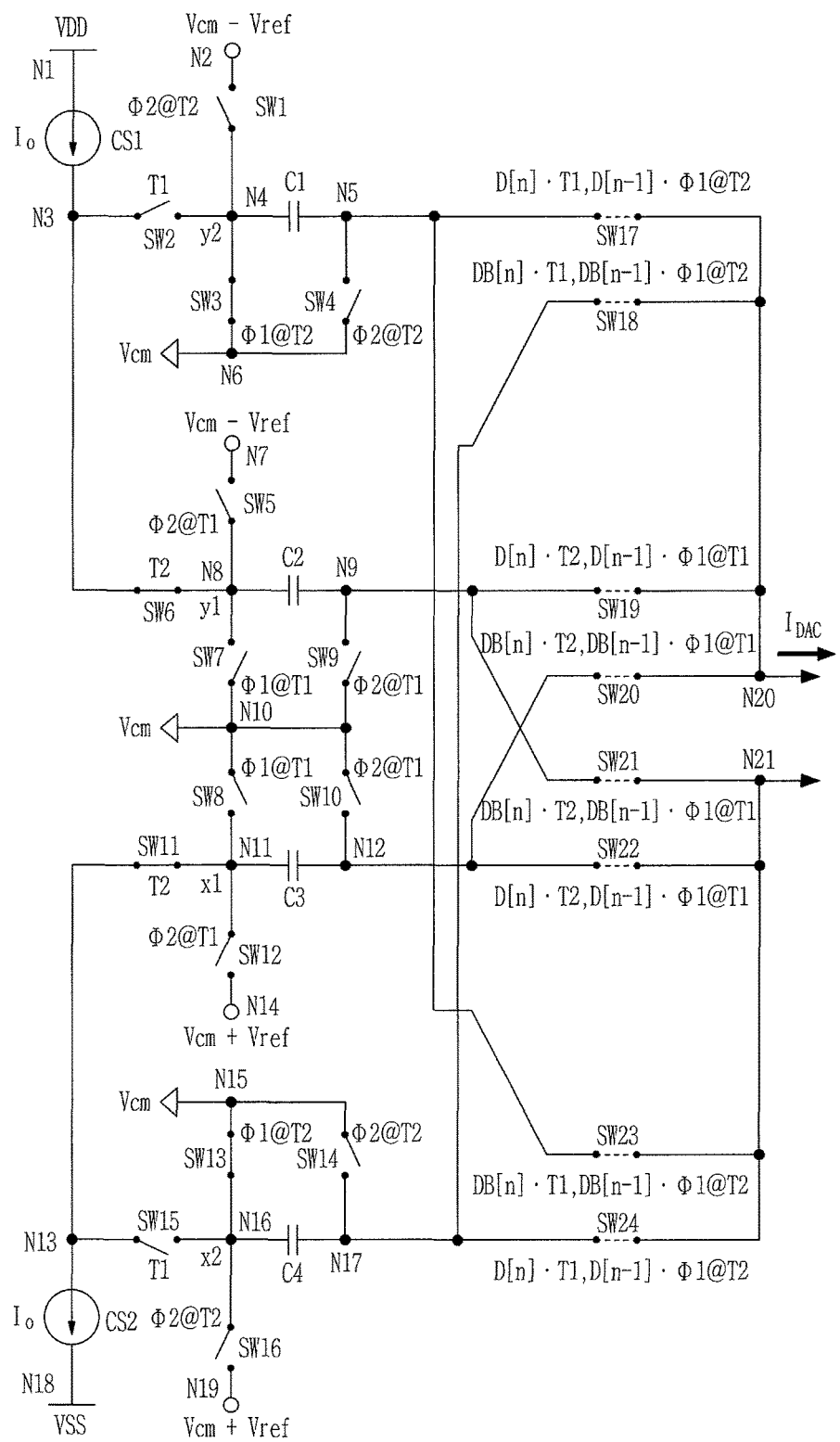

Referring to FIG. 8c, in the second sampling period T2, the first control signal Φ1 may be activated. At this time, the third switch SW3, the sixth switch SW6, the eleventh switch SW11, and the thirteenth switch SW13 may be activated.

When a current digital data signal (e.g., D[n] or DB[n]) is in a high state, the nineteenth switch SW19 and the 21st switch SW21 may be activated. Otherwise, the twentieth switch SW20 and the 22nd switch SW22 may be activated.

Moreover, when a previous digital data signal (i.e., D[n−1] or DB[n−1]) is in a high state, the seventeenth switch SW17 and the 23rd switch SW23 may be activated. Otherwise, the eighteenth switch SW18 and the 24th switch SW24 may be activated.

Figure 8D:
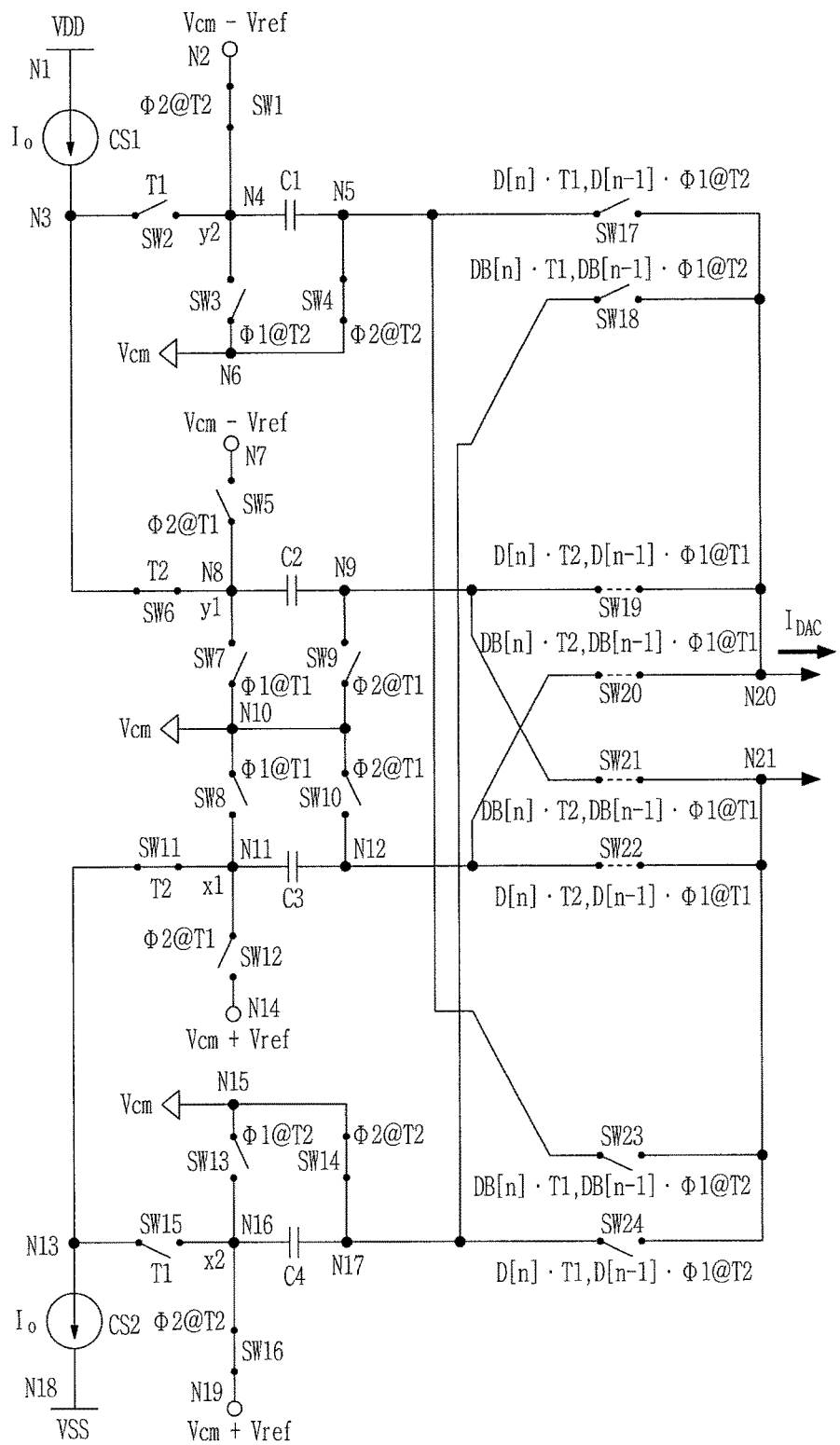

Referring to FIG. 8d, in the second sampling period T2, the second control signal Φ2 may be activated. At this time, the first switch SW1, the fourth switch SW4, the sixth switch SW6, the eleventh switch SW11, the fourteenth switch SW14, and the sixteenth switch SW16 may be activated.

When a current digital data signal (e.g., D[n] or DB[n]) is in a high state, the nineteenth switch SW19 and the 21st switch SW21 may be activated. Otherwise, the twentieth switch SW20 and the 22nd switch SW22 may be activated.

Figure 9:
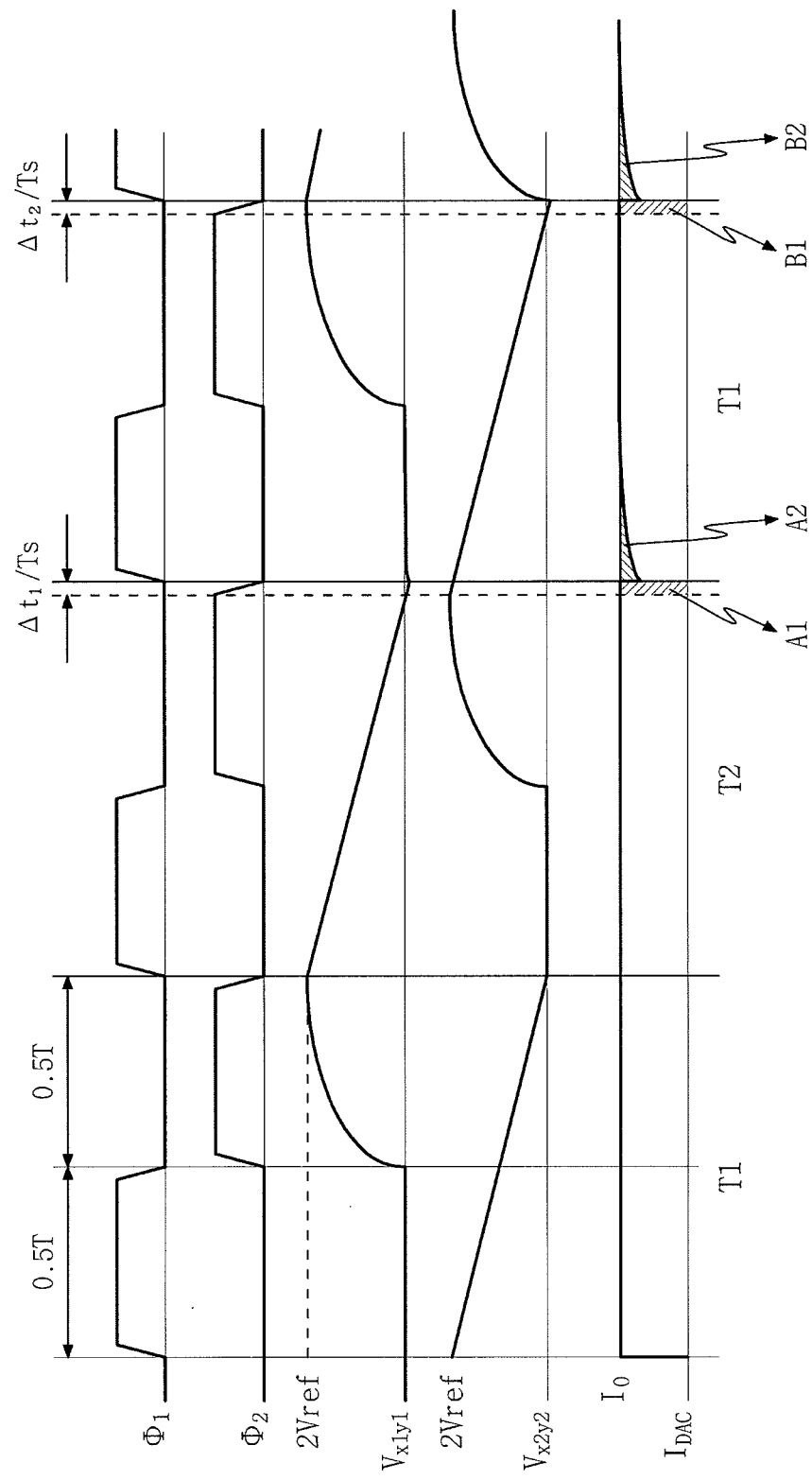
FIG. 9 is a timing diagram for describing an operation of the DAC shown in FIG. 7.

FIG. 9 is a timing diagram for describing an operation of the DAC shown in FIG. 7. Referring to FIGS. 8a and 9, in the first sampling period T1, the first control signal Φ1 may be activated.

The second switch SW2 is activated, the first current source CS1 may transmit the DAC current $I_{DAC}$ to a loop filter based on a current digital data signal. For example, when the current digital data signal is in a high state, the first current source CS1 may transmit the DAC current $I_{DAC}$ to the loop filter through the seventeenth switch SW17. Otherwise, the first current source CS1 may transmit the DAC current $I_{DAC}$ to the loop filter through the 23rd switch SW23.

Moreover, when the fifteenth switch SW15 is activated, the second current source CS2 may transmit the DAC current $I_{DAC}$ to the loop filter based on the current digital data signal. For example, when the current digital data signal is in a high state, the second current source CS2 may transmit the DAC current $I_{DAC}$ to the loop filter through the 24th switch SW24. Otherwise, the second current source CS2 may transmit the DAC current $I_{DAC}$ to the loop filter through the eighteenth switch SW18. That is, the DAC current $I_{DAC}$ may be maintained as a current of $I_0$.

The eleventh node N11 is referred to as a node x1 and the eighth node N8 is referred to as a node y1. When the seventh switch SW7 and the eighth switch SW8 are activated, the node x1 and the node y1 may be electrically connected. Accordingly, a first voltage Vx1y1 between the eighth node N8 and the eleventh node N11 may be 0 V.

That is, when seventh switch SW7 is activated, the second capacitor C2 may be charged with the common voltage Vcm. Likewise, when the eighth switch SW8 is activated, the third capacitor C3 may be charged with the common voltage Vcm. Accordingly, the first voltage Vx1y1 may be 0 V.

Moreover, the sixteenth node N16 is referred as to a node x2 and the fourth node N4 is referred as to a node y2. At this time, each of the first capacitor C1 and the fourth capacitor C4 may be discharged. Accordingly, in the first sampling period T1, the second voltage Vx2y2 may be reduced from 2Vref to 0 V.

Referring to FIGS. 8b and 9, in the first sampling period T1, the second control signal Φ2 may be activated. While the second switch SW2 is activated, the first current source CS1 may transmit the DAC current $I_{DAC}$ to the loop filter based on the current digital data signal. For example, when the current digital data signal is in a high state, the first current source CS1 may transmit the DAC current $I_{DAC}$ to the loop filter through the seventeenth switch SW17. Otherwise, the first current source CS1 may transmit the DAC current $I_{DAC}$ to the loop filter through the 23rd switch SW23.

Moreover, when the fifteenth switch SW15 is activated, the second current source CS2 may transmit the DAC current $I_{DAC}$ to the loop filter based on the current digital data signal. For example, when the current digital data signal is in a high state, the second current source CS2 may transmit the DAC current $I_{DAC}$ to the loop filter through the 24th switch SW24. Otherwise, the second current source CS2 may transmit the DAC current $I_{DAC}$ to the loop filter through the eighteenth switch SW18. That is, the DAC current $I_{DAC}$ may be maintained as a current of $I_0$.

When the fifth switch SW5, the ninth switch SW9, the tenth switch SW10 and the twelfth switch SW12 are activated, the second capacitor C2 may be charged with a negative reference voltage −Vref and the third capacitor C3 may be charged with a reference voltage Vref. At this time, the first voltage Vx1y1 may increase form 0 V to 2Vref.

Moreover, because each of the first capacitor C1 and the fourth capacitor C4 is discharged, the second voltage Vx2y2 may increase from 2Vref to 0 V.

Referring to FIGS. 8c and 9, in the second sampling period T2, the first control signal Φ1 may be activated. When the sixth switch SW6 is activated, the first current source CS1 may transmit the DAC current $I_{DAC}$ to the loop filter based on the current digital data signal. For example, when the current digital data signal is in a high state, the first current source CS1 may transmit the DAC current $I_{DAC}$ to the loop filter through the nineteenth switch SW19. Otherwise, the first current source CS1 may transmit the DAC current $I_{DAC}$ to the loop filter through the 21st switch SW21.

Moreover, when the eleventh switch SW11 is activated, the second current source CS2 may transmit the DAC current $I_{DAC}$ to the loop filter based on the current digital data signal. For example, when the current digital data signal is in a high state, the second current source CS2 may transmit the DAC current $I_{DAC}$ to the loop filter through the 22nd switch SW22. Otherwise, the second current source CS2 may transmit the DAC current $I_{DAC}$ to the loop filter through the twentieth switch SW20. That is, the DAC current $I_{DAC}$ may be maintained as a current of $I_0$.

When the second capacitor C2 is charged with the negative reference voltage −Vref and the third capacitor C3 is charged with the reference voltage Vref, the first voltage Vx1y1 may be 2Vref. At this time, each of the second capacitor C2 and the third capacitor C3 may be discharged.

Accordingly, in the second sampling period T2, the first voltage Vx1y1 may be reduced from 2Vref to 0 V.

When the third switch SW3 is activated, the first capacitor C1 may be charged with the common voltage Vcm. Likewise, when the thirteenth switch SW13 is activated, the fourth capacitor C4 may be charged with the common voltage Vcm. Accordingly, the second voltage Vx2y2 may be 0 V.

Referring to FIGS. 8d and 9, in the second sampling period T2, the second control signal Φ2 may be activated. While the sixth switch SW6 is activated, the first current source CS1 may transmit the DAC current $I_{DAC}$ to the loop filter based on the current digital data signal. For example, when the current digital data signal is in a high state, the first current source CS1 may transmit the DAC current $I_{DAC}$ to the loop filter through the nineteenth switch SW19. Otherwise, the first current source CS1 may transmit the DAC current $I_{DAC}$ to the loop filter through the 21st switch SW21.

Moreover, while the eleventh switch SW11 is activated, the second current source CS2 may transmit the DAC current $I_{DAC}$ to the loop filter based on the current digital data signal. For example, when the current digital data signal is in a high state, the second current source CS2 may transmit the DAC current $I_{DAC}$ to the loop filter through the 22nd switch SW22. Otherwise, the second current source CS2 may transmit the DAC current $I_{DAC}$ to the loop filter through the twentieth switch SW20. That is, the DAC current $I_{DAC}$ may be maintained as a current of $I_0$.

When the second capacitor C2 is charged with the negative reference voltage −Vref and the third capacitor C3 is charged with the reference voltage Vref, the first voltage Vx1y1 may be 2Vref. At this time, because each of the second capacitor C2 and the third capacitor C3 is discharged, the first voltage Vx1y1 may be reduced from 2Vref to 0 V for the second sampling period T2.

When the first switch SW1, the fourth switch SW4, the fourteenth switch SW14 and the sixteenth switch SW16 are activated, the first capacitor C1 is charged with the negative reference voltage −Vref and the fourth capacitor C4 is charged with the reference voltage Vref. Accordingly, the second voltage Vx2y2 may increase from 0 V to 2Vref.

At this time, noise caused by a clock jitter from the quantizer may occur. Accordingly, the quantizer may transmit the digital signal including a noise to the DAC 200.

The noise caused by a clock jitter from the quantizer may be included in the digital signal. Because of the noise, each of the first control signal Φ1 and the second control signal Φ2 may include a jitter. For example, each of the first control signal Φ1 and the second control signal Φ2 may include a jitter corresponding to Δt1 in the sampling period Ts. Here, the sampling period Ts may include the first sampling period T1 and the second sampling period T2.

Accordingly, the first voltage Vx1y1 or the second voltage Vx2y2 may be equal to or less than 0 V. Moreover, each of the first current source CS1 and the second current source CS2 may additionally transmit the DAC current $I_{DAC}$ to the loop filter for time Δt1. Moreover, the DAC 200 may additionally perform an integration operation using the second capacitor C2 and the third capacitor C3 for time Δt1.

The capacitor may be charged with a reference voltage in the first sampling period T1. The capacitor may be discharged in the second sampling period T2 and may generate charges corresponding to the noise. The capacitor may generate a current corresponding to the noise in the first sampling period T1. Accordingly, the current may be added or subtracted to/from the DAC current $I_{DAC}$ according to the noise caused by the clock jitter.

In the second sampling period T2, the second control signal Φ2 may include a jitter Δt1/Ts from the quantizer. Accordingly, the first voltage Vx1y1 may be equal to or less than 0 V. Here, each of the second capacitor C2 and the third capacitor C3 may additionally perform an integration operation with respect to the DAC current $I_{DAC}$ as much as A1 area due to the jitter Δt1/Ts. At the same time, the second capacitor C2 may be charged to a voltage level of the eighth node N8. Moreover, the third capacitor C3 may be charged to a voltage level of the eleventh node N11.

During the first sampling period T1, each of the second capacitor C2 and the third capacitor C3 may generate a current corresponding to the jitter Δt1/Ts through discharging. That is, in the first sampling period T1, the second capacitor C2 and the third capacitor C3 may inversely perform an integration operation as much as an area A2 through discharging.

In detail, the DAC 200 may transmit the DAC current $I_{DAC}$ having a constant magnitude to the loop filter. At the same time, the DAC 200 may transmit a current corresponding to a jitter Δt1/Ts to the loop filter. Accordingly, the DAC 200 may transmit to the loop filter a current which is resulted by subtracting the DAC current $I_{DAC}$ having a constant magnitude from a current corresponding to the jitter Δt1/Ts.

When A1 area is equal to the area A2, a noise may be removed. Otherwise, the noise may be reduced. Accordingly, the delta-sigma modulator 200 according to the embodiment of the inventive concept may remove or reduce noise caused by the jitter.

According to another embodiment of the inventive concept, in the first sampling period T1, the second control signal Φ2 may include another jitter Δt2/Ts. Accordingly, the second voltage Vx2y2 may be equal to or less than 0 V. Here, each of the first capacitor C1 and the fourth capacitor C4 may additionally perform an integration operation with respect to the DAC current $I_{DAC}$ as much as an area B1 through discharging. At the same time, the first capacitor C1 may be charged to a voltage level of the fourth node N4. Moreover, the fourth capacitor C4 may be charged to a voltage level of the sixteenth node N16.

In the second sampling period T2, each of the first capacitor C1 and the fourth capacitor C4 may generate a current corresponding to jitter Δt2/Ts to the loop filter through discharging. That is, in the second sampling period T2, the DAC 200 may inversely perform an integration operation as much as an area B2.

In detail, the DAC 200 may transmit the DAC current $I_{DAC}$ having a constant magnitude to the loop filter. At the same time, the DAC 200 may transmit a current corresponding to jitter Δt2/Ts to the loop filter. Accordingly, the DAC 200 may transmit to the loop filter a current which is resulted by subtracting the DAC current $I_{DAC}$ having a constant magnitude from a current corresponding to the jitter Δt2/Ts.

When the area B1 is equal to the area B2, a noise may be removed. Otherwise, the noise may be reduced. Accordingly, the delta-sigma modulator 200 according to the embodiment of the inventive concept may remove or reduce noise caused by the jitter.

In an embodiment, a delta-sigma modulator may include a loop filter, a quantizer configured to convert an analog output signal into a digital signal, and a DAC configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and the second capacitor is discharged and generates a charge corresponding to the noise. In a next first sampling period, the first capacitor is discharged, and at the same time, the second capacitor generates a noise current corresponding to the noise using the charge and is charged with the reference voltage.

In an embodiment, the DAC may supply a reference current having a constant magnitude to the loop filter for the first sampling period and the second sampling period.

In an embodiment, an audio codec may comprise a delta-sigma modulator that includes a loop filter, a quantizer configured to convert an analog output signal into a digital signal, and a DAC configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and the second capacitor is discharged and generates a charge corresponding to the noise. In a next first sampling period, the first capacitor is discharged, and at the same time, the second capacitor generates a noise current corresponding to the noise using the charge and is charged with the reference voltage.

In an embodiment, a system-on-chip (SoC) includes an audio codec configured to process an audio signal using a delta-sigma modulator, and a clock generator configured to generate a signal for controlling the delta-sigma modulator. The delta-sigma modulator may include a loop filter, a quantizer configured to convert an analog output signal into a digital signal, and a DAC configured to receive the digital signal and including a first capacitor and a second capacitor. In a first sampling period, the first capacitor is discharged, and at the same time, the second capacitor is charged with a reference voltage. In a second sampling period, the digital signal includes noise caused by a clock jitter, the first capacitor is charged with the reference voltage, and at the same time, the second capacitor is discharged and generates a charge corresponding to the noise. In a next first sampling period, the first capacitor is discharged, and at the same time, the second capacitor generates a noise current corresponding to the noise using the charge and is charged with the reference voltage.

Figure 10:
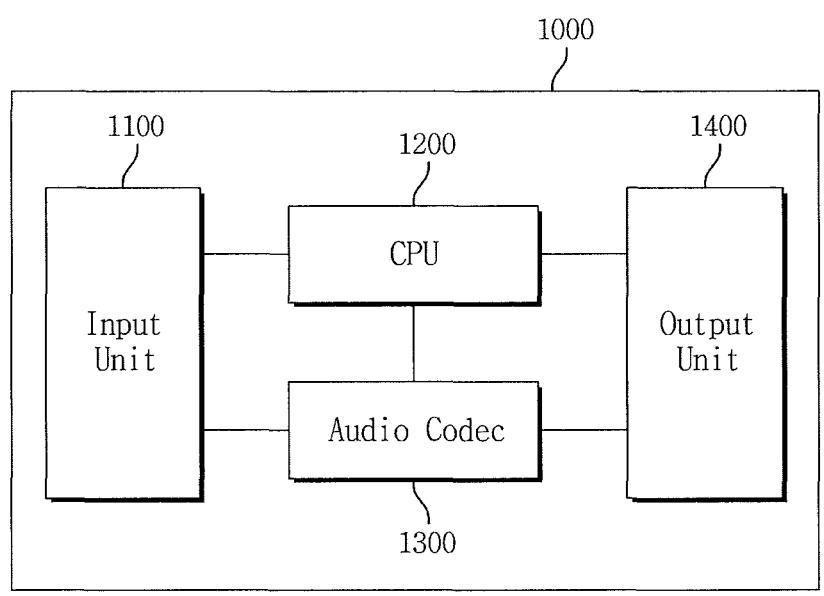
FIG. 10 is a block diagram schematically illustrating an electronic system including a delta-sigma modulator according to an embodiment of the inventive concept.

FIG. 10 is a block diagram schematically illustrating an electronic system including a delta-sigma modulator according to an embodiment of the inventive concept. Referring to FIG. 10, the electronic system 100 may be one of an audio system, a mobile device, and a digital television.

The electronic system 100 may include an input unit 1100, a CPU 1200, an audio codec 1300, and an output unit 1400. In an embodiment, the audio codec 1300 may include the delta-sigma modulator 100 shown in FIG. 6

The input unit 1100 is a module for receiving an audio signal. The input unit 1100 may include an audio input line, a microphone, and the like, but is not limited hereto.

The CPU 1200 may control overall operations of the electronic system 100. The output unit 1400 is a module for outputting an audio signal. The output unit 1400 may include an audio output line, a speaker, and the like, but is not limited hereto.

Figure 11:
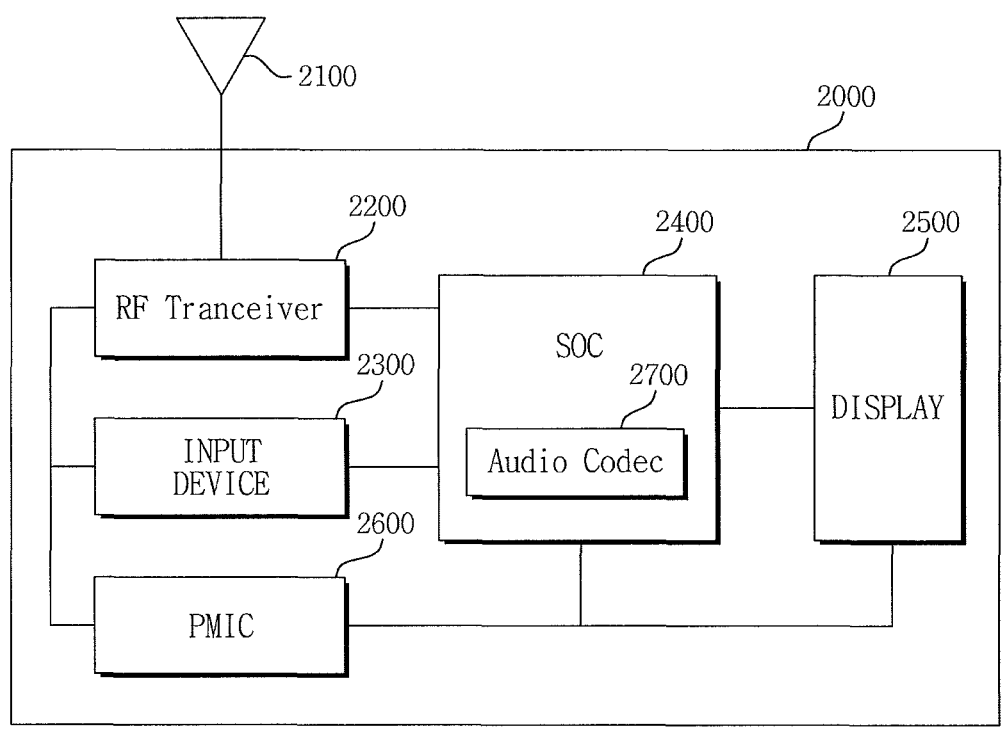
FIG. 11 is a block diagram schematically illustrating an electronic system including a delta-sigma modulator according to another embodiment of the inventive concept.

FIG. 11 is a block diagram schematically illustrating an electronic system including a delta-sigma modulator according to another embodiment of the inventive concept. Referring to FIG. 11, the electronic system 2000 may be a portable electronic device such as a mobile phone, a smart phone, a tablet personal computer, or a personal digital assistant (PDA).

The electronic system 2000 may include an antenna 2100, a wireless transceiver 2200, an input device 2300, an SoC 2400, a display 2500, and a power management integrated circuit (PMIC) 2600.

The wireless transceiver 2200 may transmit or receive a wireless signal through the antenna 2100. For example, the wireless transceiver 2200 may change the wireless signal received though the antenna 2100 into a signal in order to be processed in the SoC 2400. Moreover, the wireless transceiver 2200 may include a modem function for executing a modulation or a demodulation.

The SoC 2400 may include an audio codec 2700. In an embodiment, the audio codec 2700 may include the delta-sigma modulator 100 shown in FIG. 6

The SoC 2400 may process a signal output from the wireless transceiver 2200 and may transmit the processed signal to the display 2500. Furthermore, the wireless transceiver 2200 may change a signal output from the SoC 2400 into a wireless signal, and may output the wireless signal to the external device through the antenna 2100.

The input device 2300 is a device capable of inputting a control signal for controlling an operation of the SoC 2400 and data to be processed by the SoC 2400. The input device 2300 may be implemented with a pointing device such as a touch pad and a computer mouse, a keypad, or a keyboard.

The PMIC 2600 supplies a power to each of the wireless transceiver 2200, the input device 2300, the SoC 2400, and the display 2500.

Figure 12:
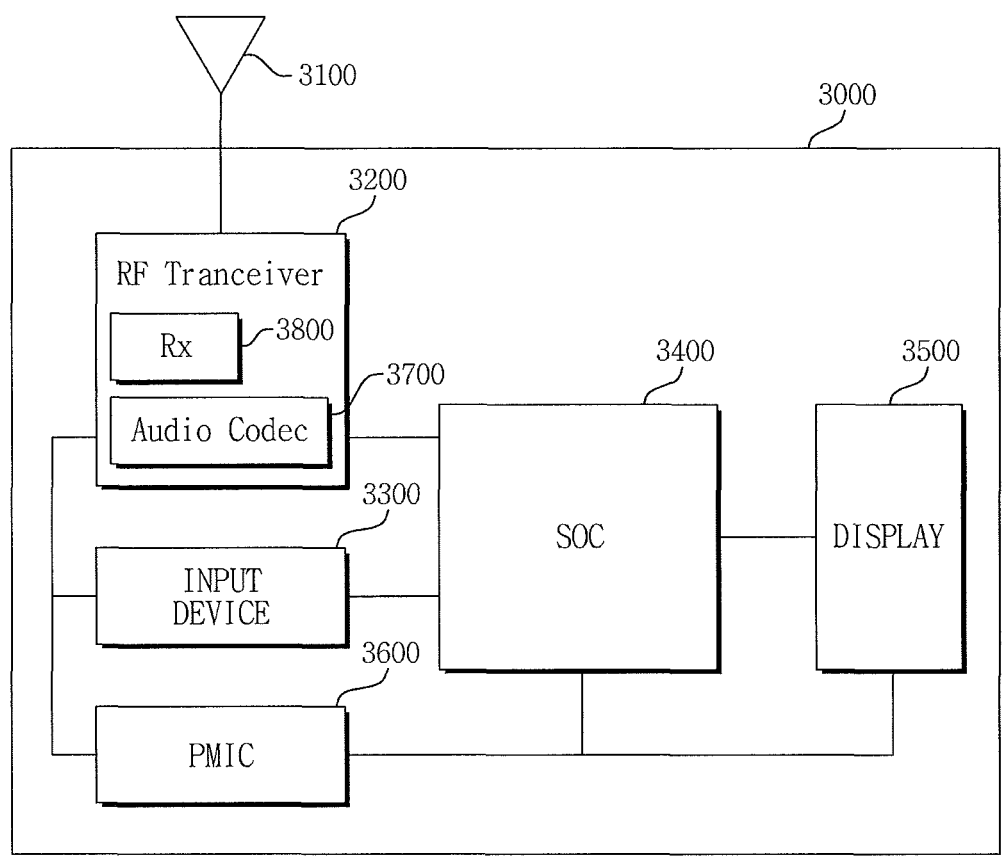
FIG. 12 is a block diagram schematically illustrating an electronic system including a delta-sigma modulator according to still another embodiment of the inventive concept.

FIG. 12 is a block diagram schematically illustrating an electronic system including a delta-sigma modulator according to still another embodiment of the inventive concept. Referring to FIG. 12, the electronic system 3000 according to still another embodiment of the inventive concept may be a portable electronic device such as a mobile phone, a smart phone, a tablet personal computer, or a PDA.

The electronic system 3000 may include an antenna 3100, a wireless transceiver 3200, an input device 3300, an SoC 3400, a display 3500, and a PMIC 3600.

The wireless transceiver 3200 may transmit or receive a wireless signal through the antenna 3100. For example, the wireless transceiver 3200 may change the wireless signal received though the antenna 3100 into a signal in order to be processed in the SoC 3400. Moreover, the wireless transceiver 3200 may include a modem function for executing a modulation or a demodulation.

The wireless transceiver 3200 may include an audio codec 3700 and a receiver 3800. In an embodiment, each of the audio codec 3700 and a receiver 3800 may include the delta-sigma modulator 100 shown in FIG. 6

The SoC 3400 may process a signal output from the wireless transceiver 3200 and may transmit the processed signal to the display 3500. Furthermore, the wireless transceiver 3200 may change a signal output from the SoC 3400 into a wireless signal and may output the wireless signal to the external device through the antenna 3100.

The input device 3300 may be a device capable of inputting a control signal for controlling an operation of the SoC 3400 and data to be processed by the SoC 3400. The input device 3300 may be implemented with a pointing device such as a touch pad and a computer mouse, a keypad, or a keyboard.

The PMIC 3600 supplies a power to each of the wireless transceiver 3200, the input device 3300, the SoC 3400, and the display 3500.

In the electronic system 2000 shown in FIG. 11, the audio codec 2700 may be implemented as the SoC 2400. On the other hand, in the electronic system 3000 shown in FIG. 12, the audio codec 3700 may be implemented as the wireless transceiver 3200.

Figure 13:
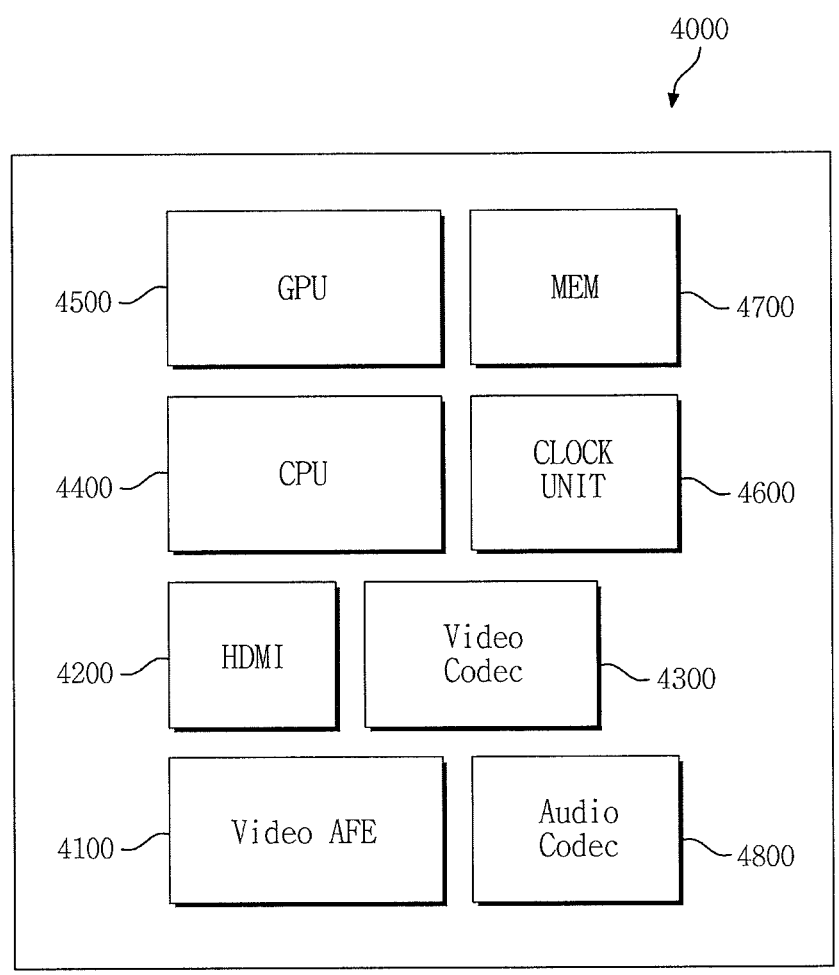
FIG. 13 is a block diagram schematically illustrating a system-on-chip (SoC) according to an embodiment of the inventive concept.

FIG. 13 is a block diagram schematically illustrating an SoC according to an embodiment of the inventive concept. Referring to FIG. 13, an SoC 4000 may include a video analog front end (AFE) 4100, a high definition multimedia interface (HDMI) unit 4200, a video codec 4300, a CPU 4400, a graphic processing unit (GPU) 4500, a clock unit 4600, a memory 4700, and an audio codec 4800.

The video AFE 4100 is a block for receiving a video signal. The video AFE 4100 may include an RGB front end (not shown) for processing an RGB signal or a YPbPr signal, CVBS front end (not shown) for processing a Syndicat des Constructeurs d'Appareils Radiorécepteurs et Téléviseurs (SCART) signal, which is one of video communication methods, connected with 21 pins signal, or a composite video banking sync (CVBS) signal, and a SIF/CH/IF front end (not shown) for processing an SIF/CH/IF signal. The sound intermediate frequency (SIF) signal may be an audio signal. The CH signal may be a video signal of a digital TV. The IF signal may be an analog video signal.

The HDMI unit 4200 receives an HDMI signal and processes the received HDMI signal.

The video codec 4300 may demodulate or decode the video signal received through the video AFE 4100 or the HDMI unit 4200.

The CPU 4400 may generally control overall operations of the SoC 4000. The clock unit 4600 may include a system phase locked loop (PLL) and supply a clock signal required in an internal operation of the SoC 4000.

The memory 4700 may include an internal memory device (e.g., a volatile memory or a nonvolatile memory) or a memory controller for controlling an external memory device.

The audio codec 4800 may process an audio signal. The audio codec 4800 may include the delta-sigma modulator 100 shown in FIG. 6.

Figure 14:
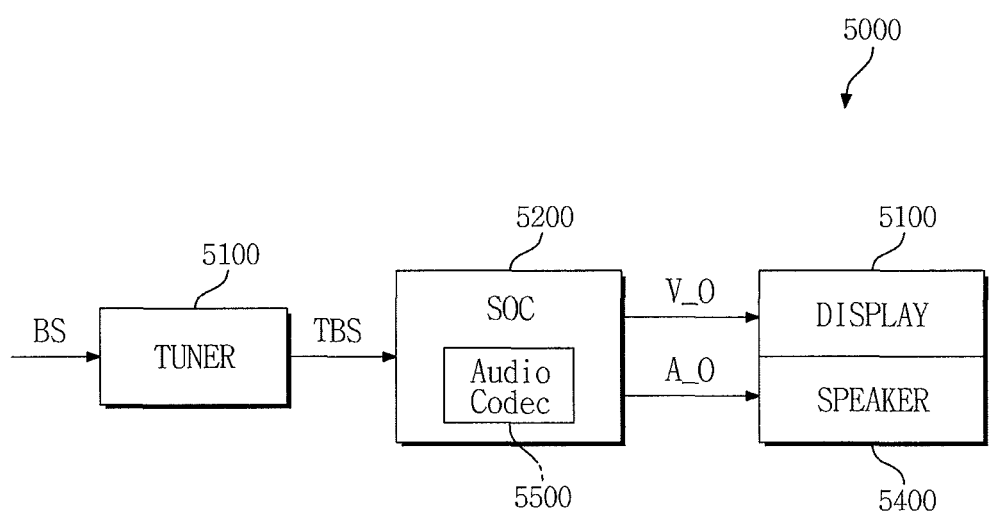
FIG. 14 is a block diagram schematically illustrating a digital television (DTV) system according to an embodiment of the inventive concept.

FIG. 14 is a block diagram schematically illustrating a digital television (DTV) system according to an embodiment of the inventive concept. Referring to FIG. 14, a DTV system 5000 may be implemented with a satellite DTV system, a cable DTV system, a handheld DTV system, or a terrestrial DTV system. The DTV system 5000 may include a high-definition (HD) TV system. The handheld DTV system may be implemented with a mobile device, a smart phone, a tablet PC, a car navigation device, a PDA, or a portable multimedia player (PMP).

The DTV system 5000 according to the embodiment of the inventive concept may include a tuner 5100, an SoC 5200, a display 5300, and a speaker 5400.

The tuner 5100 includes a circuit, a logic, and/or a code. The tuner 5100 may receive a broadcast signal BS, and may generate a single-ended sound intermediate frequency signal having a carrier frequency of several MHz and/or differential TV broadcast signals.

The differential TV broadcast signals may include differential digital TV broadcast signals such as DTV video signals and DTV audio intermediate frequency signals. Moreover, the differential TV broadcast signals may include differential analog TV broadcast signals such as analog video signals and analog audio intermediate frequency signals.

An output signal TBS of the tuner 5100 may be input to the SoC 5200, and may be processed as a video signal V_O and an audio signal A_O which are output to each of the display 5300 and the speaker 5400. The display 5300 and the speaker 5400 may be implemented as a unibody.

The SoC 5200 may be implemented with the SoC 4000 shown in FIG. 13. The SoC 5200 may include the audio codec 5500. The audio codec 5500 may include the delta-sigma modulator 100 shown in FIG. 6.

The delta-sigma modulator according to the embodiment of the inventive concept can remove or reduce noise caused by a clock jitter.

The inventive concept may be applied to an audio codec and an SoC having the same.

Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A delta-sigma modulator comprising:
a loop filter;
a quantizer configured to convert an analog signal into a digital signal; and
a digital-to-analog converter (DAC) configured to receive the digital signal, and including a first capacitor and a second capacitor,
wherein in a first sampling period, the first capacitor is discharged, and at the same time, the second capacitor is charged with a reference voltage,
in a second sampling period, the digital signal includes a noise caused by a clock jitter, the first capacitor is charged with the reference voltage, and the second capacitor is discharged and generates a charge corresponding to the noise, and
in a subsequent first sampling period that is after the second sampling period, the first capacitor is discharged, and at the same time, the second capacitor generates a noise current corresponding to the noise using the charge and is charged with the reference voltage.

2. The delta-sigma modulator of claim 1, wherein the DAC supplies a reference current having a constant magnitude to the loop filter for the first sampling period and the second sampling period.

3. The delta-sigma modulator of claim 2, wherein the DAC supplies the reference current to the loop filter, and supplies the noise current to the loop filter, and
a direction of each of the noise current and the reference current is determined based on the noise.

4. The delta-sigma modulator of claim 1, wherein the DAC comprises:
a first current source connected between a first node and a third node;
a first switch connected between a second node and a fourth node, and activated in response to a first control signal for the second sampling period;
a second switch connected between the third node and the fourth node, and activated for the first sampling period;
the first capacitor connected between the fourth node and a fifth node;
a third switch connected between the fourth node and a sixth node, and activated in response to the first control signal for the second sampling period;
a fourth switch connected between the fifth node and the sixth node, and activated in response to the first control signal for the second sampling period;
a fifth switch connected between a seventh node and an eighth node, and activated in response to the first control signal for the second sampling period;
a sixth switch connected between the third node and the eighth node, and activated for the second sampling period;
the second capacitor connected between the eighth node and a ninth node;
a seventh switch connected between the eighth node and a tenth node, and activated in response to the first control signal for the first sampling period;
an eighth switch connected between the tenth node and an eleventh node, and activated in response to the first control signal for the first sampling period;
a ninth switch connected between the ninth node and the tenth node, and activated in response to the second control signal for the first sampling period;
a tenth switch connected between the tenth node and a twelfth node, and activated in response to the second control signal for the first sampling period;
an eleventh switch connected between the eleventh node and a thirteenth node, and activated for the second sampling period;
a third capacitor connected between the eleventh node and the twelfth node;
a twelfth switch connected between the eleventh node and a fourteenth node, and activated in response to the second control signal for the first sampling period;
a thirteenth switch connected between a fifteenth node and a sixteenth node, and activated in response to the first control signal for the second sampling period;
a fourteenth switch connected between the fifteenth node and a seventeenth node, and activated in response to the second control signal for the second sampling period;
a fifteenth switch connected between the thirteenth node and the sixteenth node, and activated for the first sampling period;
a fourth capacitor connected between the sixteenth node and the seventeenth node;
a sixteenth switch connected between the sixteenth node and a nineteenth node, and activated in response to the second control signal for the second sampling period; and
a second current source connected between the thirteenth node and an eighteenth node.

5. The delta-sigma modulator of claim 4, wherein the DAC further comprises:
a seventeenth switch connected between the fifth node and a twentieth node, and activated when a current digital data signal is in a high state for the first sampling period or when a previous digital data signal is in the high state for the second sampling period, and the first control signal is activated;
an eighteenth switch connected between the seventeenth node and the twentieth node, and activated when the current digital data signal is in a low state for the first sampling period or when the previous digital data signal is in the low state for the second sampling period, and the first control signal is activated;
a nineteenth switch connected between the ninth node and the twentieth node, and activated when the current digital data signal is in the high state for the second sampling period or when the previous digital data signal is in the high state for the first sampling period, and the first control signal is activated;
a twentieth switch connected between the twelfth node and the twentieth node, and activated when the current digital data signal is in the low state for the second sampling period or when the previous digital data signal is in the low state for the first sampling period, and the first control signal is activated;

a 21st switch connected between the ninth node and a 21st node, and activated when the current digital data signal is in the low state for the second sampling period or when the previous digital data signal is in the low state for the first sampling period, and the first control signal is activated;

a 22nd switch connected between the twelfth node and the 21st node, and activated when the current digital data signal is in the high state for the second sampling period or when the previous digital data signal is in the high state for the first sampling period, and the first control signal is activated;

a 23rd switch connected between the fifth node and the 21st node, and activated when the current digital data signal is in the low state for the first sampling period or when the previous digital data signal is in the low state for the second sampling period, and the first control signal is activated; and a 24th switch connected between the seventeenth node and the 21st node, and activated when the current digital data signal is in the high state for the first sampling period or when the previous digital data signal is in the high state for the second sampling period, and the first control signal is activated.

6. The delta-sigma modulator of claim 5, wherein each of the twentieth node and the 21st node is connected to virtual ground nodes of an operational amplifier in the loop filter, and the virtual ground nodes are connected to an inverting input port and a non-inverting input port, respectively.

7. The delta-sigma modulator of claim 5, further comprising a two-phase clock generator configured to generate the first sampling period, the second sampling period, the first control signal, and the second control signal.

8. The delta-sigma modulator of claim 5, wherein the quantizer transmits the current digital data signal and the previous digital data signal to the DAC.

9. The delta-sigma modulator of claim 4, wherein the DAC has a differential structure, and the first current source and the second current source are implemented with one current source.

10. The delta-sigma modulator of claim 4, wherein a power voltage is applied to the first node, a voltage which is resulted by subtracting a reference voltage from a common voltage is applied to the second node, the common voltage is applied to the sixth node, a voltage which is resulted by subtracting the reference voltage from the common voltage is applied to the seventh node, the common voltage is applied to the tenth node, a voltage which is resulted by subtracting the reference voltage from the common voltage is applied to the seventh node, a voltage which is resulted by adding the reference voltage to the common voltage is applied to the tenth node, the common voltage is applied to the fifteenth node, a ground voltage is applied to the eighteenth node, and a voltage which is resulted by adding the reference voltage to the common voltage is applied to the nineteenth node.

11. A delta-sigma modulator comprising:
a loop filter;
a switch;
a quantizer configured to convert an analog signal into a digital signal;
a digital-to-analog converter (DAC) configured to receive the digital signal and including a first capacitor and a second capacitor; and
a two-phase clock generator configured to receive a master clock, and to generate one or more control signals for controlling the DAC,
wherein in a first sampling period, the first capacitor is discharged, and at the same time, the second capacitor is charged with a reference voltage,
in a second sampling period, the digital signal includes noise caused by a clock jitter, the first capacitor is charged with the reference voltage, and the second capacitor is discharged and generates a charge corresponding to the noise,
in a subsequent first sampling period that is after the second sampling period, the first capacitor is discharged, and at the same time, the second capacitor generates a noise current corresponding to the noise using the charge and is charged with the reference voltage, and
the switch is configured to operate based on the first sampling period, the second sampling period or the subsequent first sampling period.

12. The delta-sigma modulator of claim 11, wherein the DAC supplies a reference current having a constant magnitude to the loop filter for the first sampling period and the second sampling period.

13. The delta-sigma modulator of claim 12, wherein the DAC supplies the reference current to the loop filter, and supplies the noise current to the loop filter, and a direction of each of the noise current and the reference current is determined based on the noise.

14. The delta-sigma modulator of claim 11, wherein the DAC includes a switched-current DAC, a switched-capacitor DAC, a first DAC adder, a one-cycle delay unit, and a second DAC adder.

15. The delta-sigma modulator of claim 11, wherein the DAC includes one or more current sources, and one or more switches.

16. A system-on-chip (SoC) comprising:
a delta-sigma modulator;
an audio codec configured to process an audio signal using the delta-sigma modulator; and
a clock generator configured to generate a signal for controlling the delta-sigma modulator,
wherein the delta-sigma modulator comprises:
a loop filter;
a quantizer configured to convert an analog signal into a digital signal;
a digital-to-analog converter (DAC) configured to receive the digital signal and including a first capacitor and a second capacitor; and
a clock generator configured to receive a master clock, and to generate one or more control signals for controlling the DAC,
wherein in a first sampling period, the first capacitor is discharged, and at the same time, the second capacitor is charged with a reference voltage,
in a second sampling period, the digital signal includes noise caused by a clock jitter, the first capacitor is charged with the reference voltage, and the second capacitor is discharged and generates a charge corresponding to the noise, and in a third sampling period, the second capacitor generates a noise current corresponding to the noise.

17. The SoC of claim 16, wherein the DAC supplies a reference current having a constant magnitude to the loop filter for the first sampling period and the second sampling period.

18. The SoC of claim 17, wherein:

the DAC supplies the reference current to the loop filter, and at the same time, supplies the noise current to the loop filter; and a direction of each of the noise current and the reference current is determined according to the noise.

19. The SoC of claim 16, wherein the clock generator generates the first sampling period and the second sampling period.

20. The SoC of claim 16, wherein the quantizer transmits a current digital data signal and a previous digital data signal to the DAC.

* * * * *